US012641775B2

(12) United States Patent
Lee et al.

(10) Patent No.: US 12,641,775 B2
(45) Date of Patent: May 26, 2026

(54) SEMICONDUCTOR MEMORY DEVICE

(71) Applicant: Samsung Electronics Co., Ltd.,
Suwon-si (KR)

(72) Inventors: Jun-Bum Lee, Suwon-si (KR);
Dongsik Kong, Suwon-si (KR); **Jihye
Kwon, Suwon-si (KR); Junsoo Kim**,
Suwon-si (KR); Jae Hyun Choi,
Suwon-si (KR); Hyun Seung Choi,
Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 409 days.

(21) Appl. No.: 18/493,196

(22) Filed: Oct. 24, 2023

(65) Prior Publication Data

US 2024/0341083 A1      Oct. 10, 2024

(30) Foreign Application Priority Data

Apr. 10, 2023      (KR) ........................ 10-2023-0046722

(51) Int. Cl.
*H10B 12/00* (2023.01)
(52) U.S. Cl.
CPC .......... *H10B 12/34* (2023.02); *H10B 12/053*
(2023.02); *H10B 12/315* (2023.02); *H10B*
*12/482* (2023.02)

(58) Field of Classification Search
CPC .... H10B 12/34; H10B 12/053; H10B 12/315;
H10B 12/482; H10B 12/488; H10B
12/033
See application file for complete search history.

(56) References Cited

U.S. PATENT DOCUMENTS

| | | | |
|---|---|---|---|
| 9,431,496 B2 | 8/2016 | Kang | |
| 9,818,843 B2 | 11/2017 | Oh et al. | |
| 10,062,613 B1 | 8/2018 | Chang et al. | |
| 10,833,088 B2 | 11/2020 | Im et al. | |
| 10,910,224 B2 | 2/2021 | Jang et al. | |
| 11,600,710 B2 | 3/2023 | Kim | |
| 2018/0342518 A1* | 11/2018 | Kim | H10B 12/056 |
| 2022/0122888 A1 | 4/2022 | Kim et al. | |

* cited by examiner

*Primary Examiner* — Mohammed R Alam
(74) *Attorney, Agent, or Firm* — Harness, Dickey &
Pierce, P.L.C.

(57) ABSTRACT
Active regions defined by device isolation layer are provided
on a substrate. A word line crossing the active regions and
a gate dielectric layer between the word line and the active
regions are provided. A capping insulating pattern covering
an upper surface of the word line and a bit line on the word
line are provided. The word line may include a first con-
ductive pattern and a second conductive pattern on the first
conductive pattern. The first conductive pattern may include
a first metal element. The second conductive pattern may
include the first metal element, a work function adjustment
element, and a diffusion barrier element. An atomic radius of
the diffusion barrier element may be smaller than an atomic
radius of the first metal element.

20 Claims, 25 Drawing Sheets

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2023-0046722, filed on Apr. 10, 2023, in the Korean Intellectual Property Office, the entire contents of which are hereby incorporated by reference.

BACKGROUND OF THE INVENTION

Some inventive concepts relate to a semiconductor, and, for example, to a semiconductor memory device and a method of manufacturing the same.

Semiconductor devices are widely used in an electronic industry because of their small size, multi-functionality, and/or low manufacture costs. Semiconductor devices have been highly integrated with the development of the electronic industry. Widths and spaces of patterns of the semiconductor devices are being reduced for the high integration of the semiconductor devices. However, new exposure techniques and/or very expensive exposure techniques are required for fineness of the patterns such that it is difficult to highly integrate the semiconductor devices. Thus, various research has been conducted into new integration techniques.

SUMMARY

Some example embodiments of inventive concepts relate to a semiconductor memory device capable of limiting or preventing a work function of a first conductive pattern from being changed by a work function adjustment element and a manufacturing method thereof.

A semiconductor memory device according to some example embodiments of the inventive concepts may include active regions defined by a device isolation layer, on a substrate, a word line crossing the active regions, a gate dielectric layer between the word line and the active regions, a capping insulating pattern covering an upper surface of the word line, and a bit line on the word line, wherein the word line may include a first conductive pattern and a second conductive pattern on the first conductive pattern, the first conductive pattern may include a first metal element, the second conductive pattern may include the first metal element, a work function adjustment element, and a diffusion barrier element, and an atomic radius of the diffusion barrier element may be smaller than an atomic radius of the first metal element.

A semiconductor memory device according to some example embodiments of the inventive concepts may include active regions defined by a device isolation layer, on a substrate, a word line crossing the active regions, a gate dielectric layer between the word line and the active regions, a capping insulating pattern covering an upper surface of the word line, and a bit line provided on the word line, wherein the word line may include a first conductive pattern and a second conductive pattern on the first conductive pattern, the first conductive pattern may include a first metal element, the second conductive pattern may include the first metal element, a work function adjustment element, and a diffusion barrier element, and a grain size of the second conductive pattern may be smaller than a grain size of the first conductive pattern.

A semiconductor memory device according to some example embodiments of the inventive concepts may include active regions including a first impurity region and a second impurity region and defined by a device isolation layer, on a substrate, word lines extending in a first direction on the active regions, capping insulating patterns covering upper surfaces of each of the word lines, bit lines on the word lines and extending in a second direction crossing the first direction, contact plugs provided between the bit lines and connected to the second impurity region, and data storage units provided on the contact plugs, wherein each of the word lines may include a first conductive pattern and a second conductive pattern on the first conductive pattern, the first conductive pattern may include a first metal element, the second conductive pattern may include the first metal element, a work function adjustment element, and a diffusion barrier element, and an atomic radius of the diffusion barrier element may be smaller than an atomic radius of the first metal element.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A to 9A are cross-sectional views illustrating a method of manufacturing a semiconductor memory device according to example embodiments of some inventive concepts, and are cross-sectional views taken along lines A1-A2 and B1-B2 of FIG. 1.

FIGS. 4B to 9B are cross-sectional views illustrating a method of manufacturing a semiconductor memory device according to some example embodiments of inventive concepts, and are cross-sectional views taken along line C1-C2 of FIG. 1.

FIGS. 11A to 13A are cross-sectional views illustrating a method of manufacturing a semiconductor memory device according to some example embodiments, and are cross-sectional views along lines A1-A2 and B1-B2 of FIG. 1.

FIGS. 11B to 13B are cross-sectional views illustrating a method of manufacturing a semiconductor memory device according to some example embodiments, and are cross-sectional views taken along line C1-C2 of FIG. 1.

DETAILED DESCRIPTION

Hereinafter, a semiconductor memory device and a manufacturing method thereof according to the some example embodiments of inventive concepts will be described in detail with reference to the accompanying drawings.

Expressions such as "at least one of," when preceding a list or group of elements, modify the entire list or group of elements and do not modify the individual elements of the list or group. For example, "at least one of A, B, and C," and similar language (e.g., "at least one selected from the group consisting of A, B, and C"), may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., +10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes. When ranges are specified, the range includes all values therebetween such as increments of 0.1%.

Figure 1:
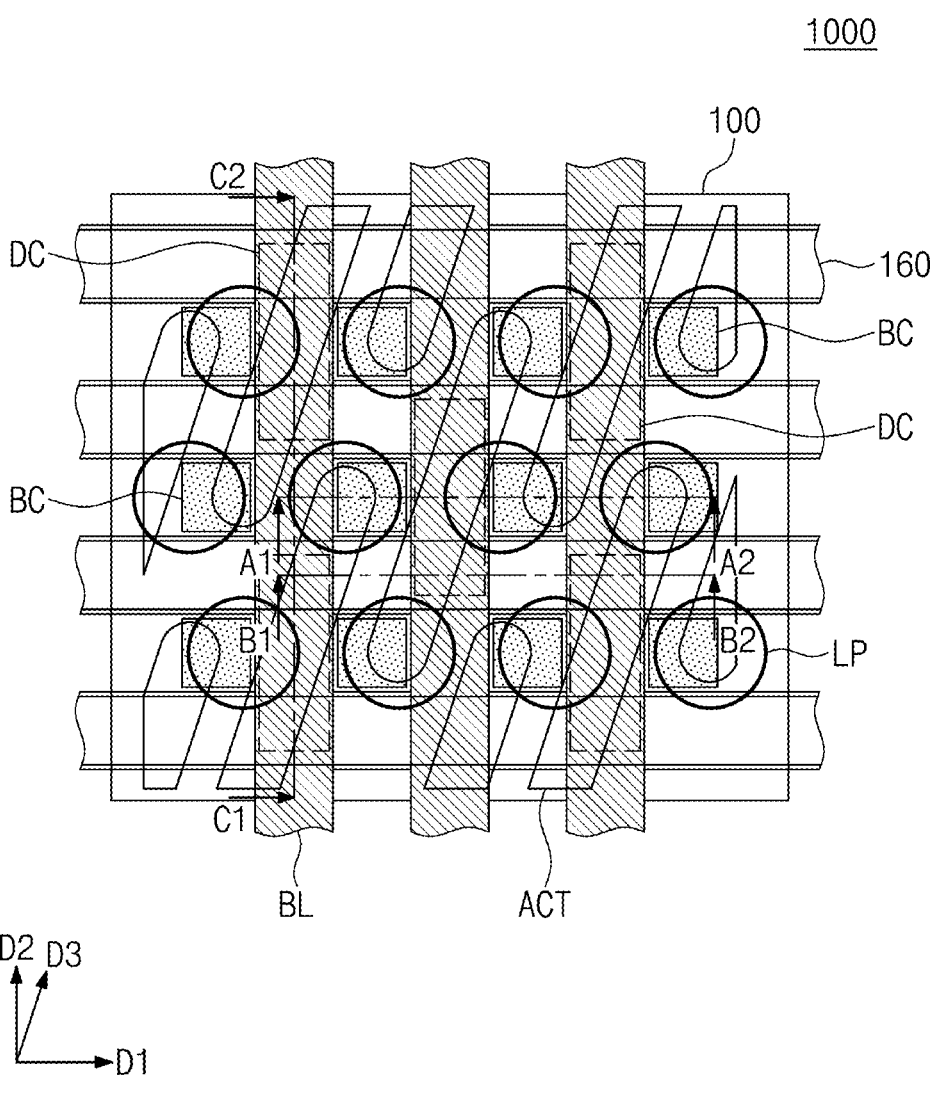
FIG. 1 is a plan view illustrating a semiconductor memory device according to example embodiments of some inventive concepts.
Figure 2A:
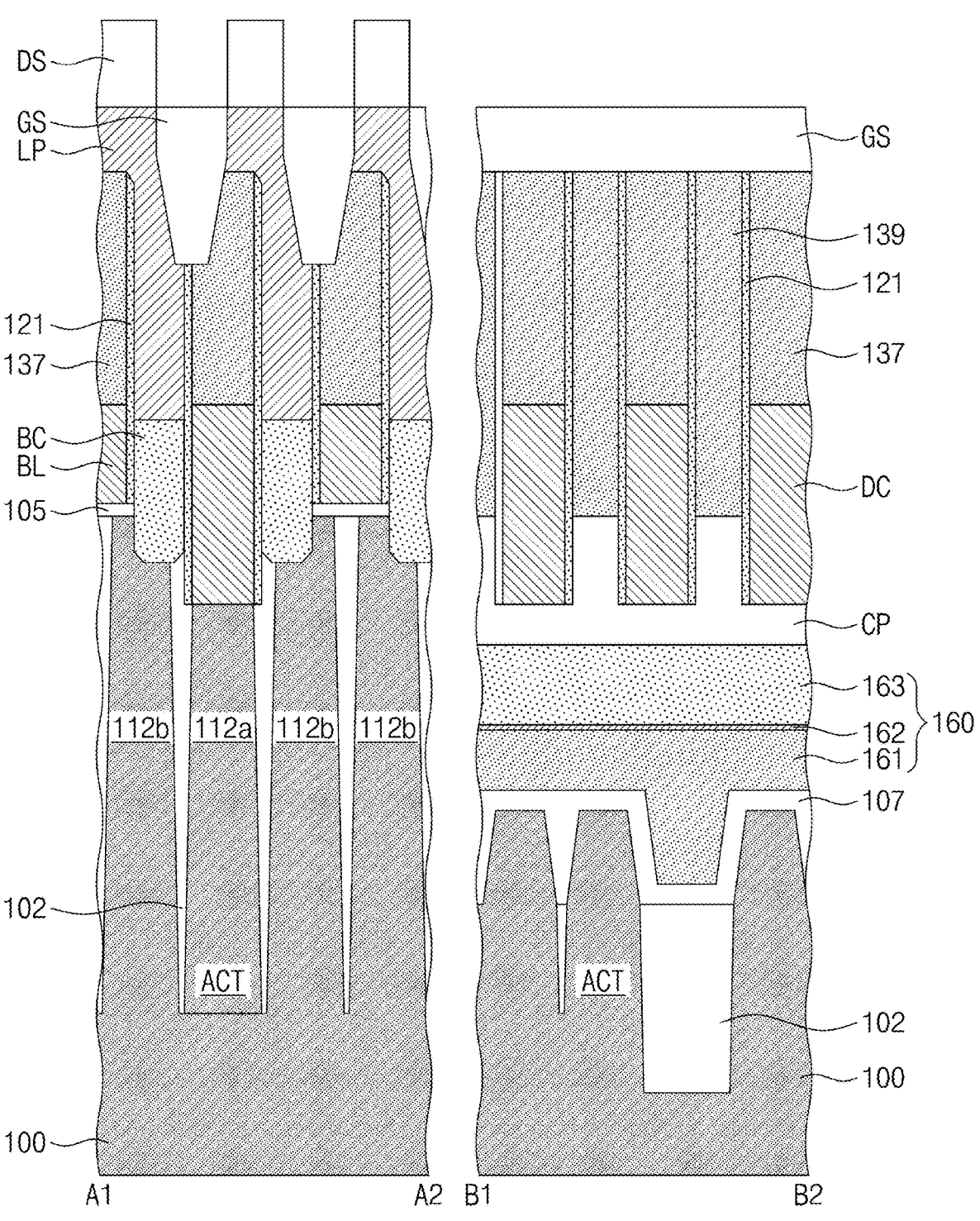
FIG. 2A is a cross-sectional view taken along lines A1-A2 and B1-B2 of FIG. 1.
Figure 2B:
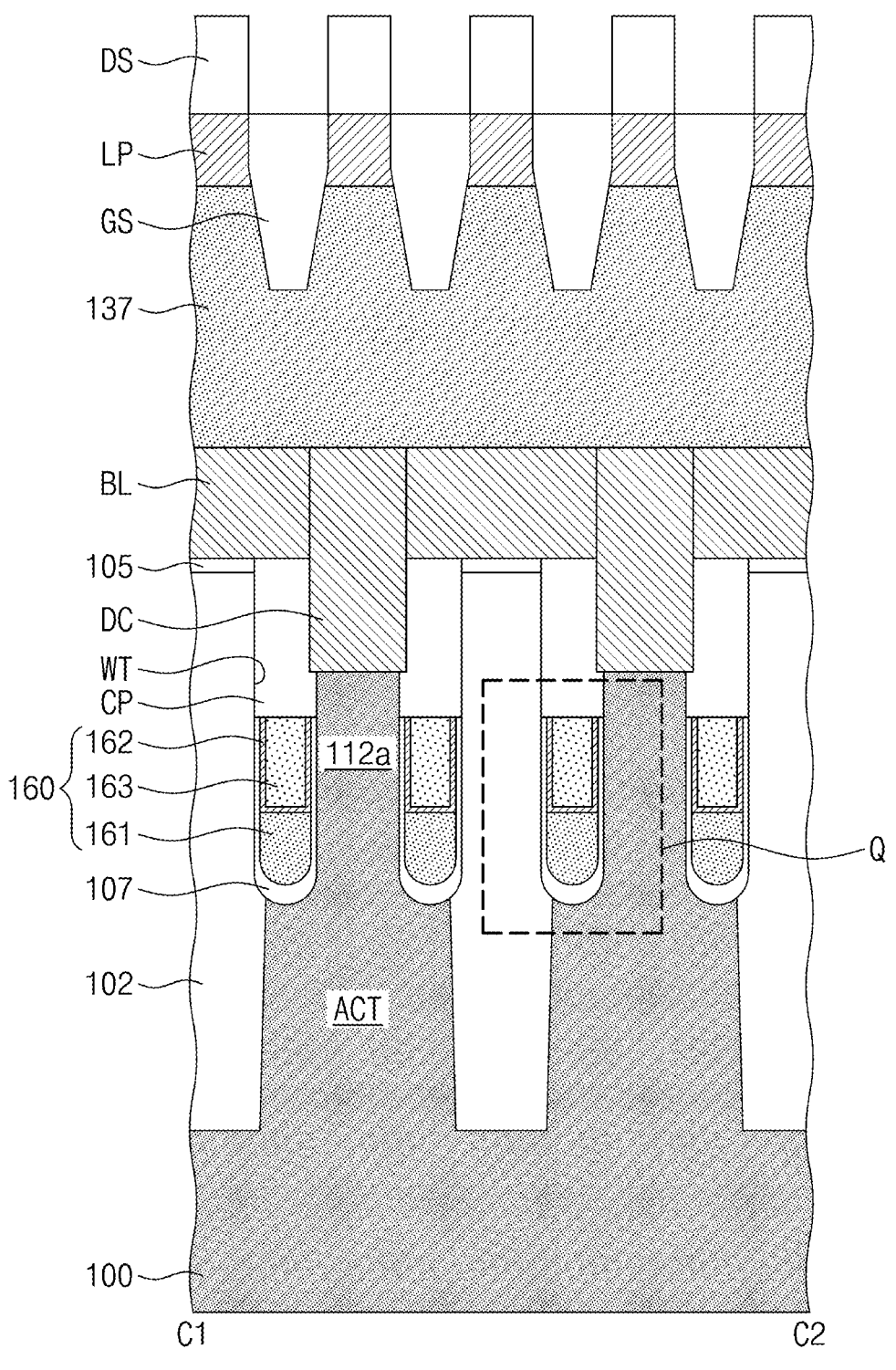
FIG. 2B is a cross-sectional view taken along line C1-C2 in FIG. 1.
Figure 3:
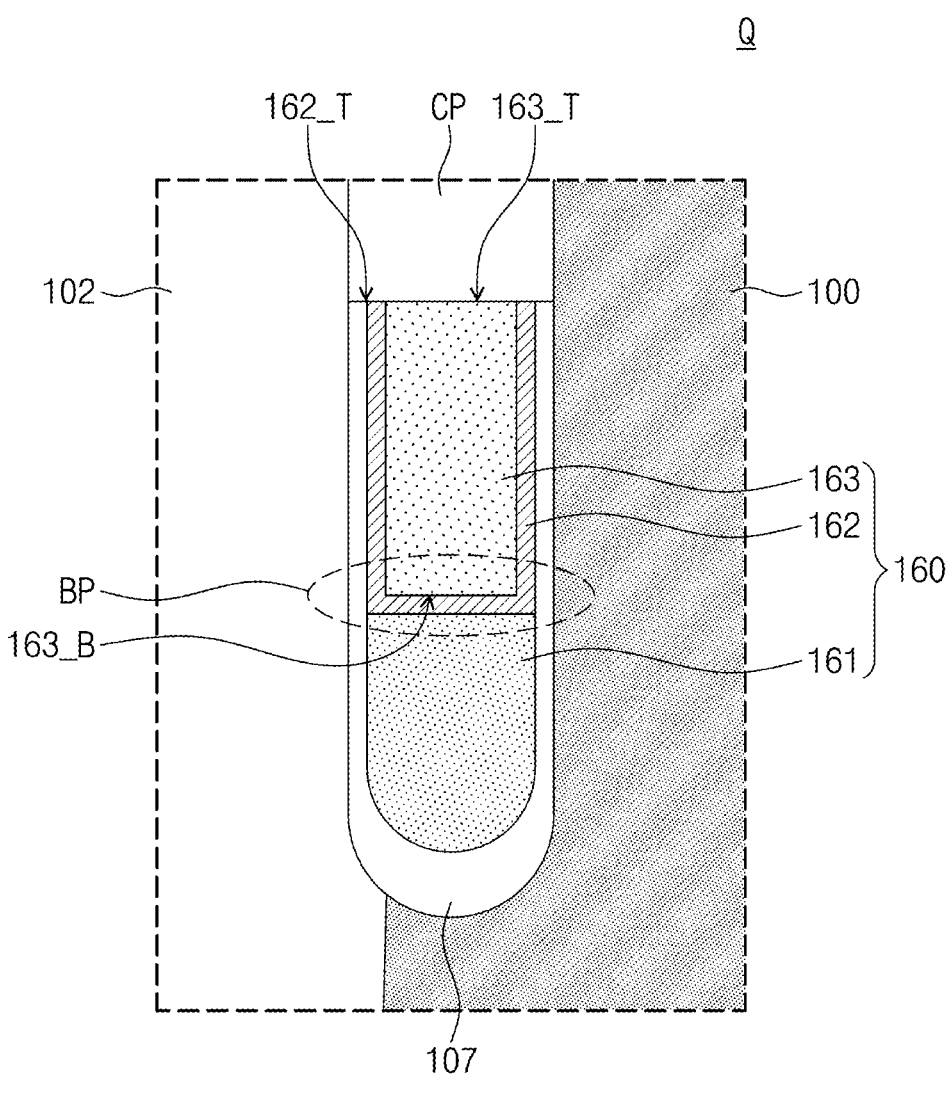
FIG. 3 is an enlarged view of region 'Q' of FIG. 2A.

FIG. 1 is a plan view illustrating a semiconductor memory device according to some example embodiments of the inventive concepts. FIG. 2A is a cross-sectional view taken along lines A1-A2 and B1-B2 of FIG. 1. FIG. 2B is a cross-sectional view taken along line C1-C2 in FIG. 1. FIG. 3 is an enlarged view of region 'Q' of FIG. 2A.

Referring to FIGS. 1, 2A and 2B, a semiconductor memory device 1000 is provided. Device isolation patterns 102 may be disposed on the substrate 100 to define active regions ACT. The substrate 100 may be a semiconductor substrate such as a single crystal silicon substrate. Each of the active regions ACT may have an island shape and be separated from each other. Each of the active regions ACT may have a bar shape elongated in a third direction D3. When viewed in a plan view, the active regions ACT may be portions of the substrate 100 surrounded by the device isolation pattern 102. The active regions ACT may be arranged parallel to each other in the third direction D3, and an end of one active region ACT may be arranged adjacent to a center of another active region ACT adjacent thereto.

Word lines 160 crossing the active regions ACT may be provided. One active region ACT may cross the pair of word lines 160. The word lines 160 may be respectively disposed in trenches WT formed in the device isolation pattern 102 and the active regions ACT. The word lines 160 may be parallel to a first direction D1 crossing the third direction D3. The word lines 160 may include a conductive material. A gate dielectric layer 107 may be disposed between the word line 160 and an inner surface of the trench WT. The gate dielectric layer 107 may include at least one of silicon oxide, silicon nitride, silicon oxynitride, and a high dielectric material, but example embodiments are not limited thereto A work function adjustment element to be described below may be included on the gate dielectric layer 107.

A first impurity region 112a may be disposed in each active region ACT between the pair of word lines 160, and a pair of second impurity regions 112b may be disposed at both edge regions of each active region ACT. The first and second impurity regions 112a and 112b may be regions doped with n-type impurities, for example. The first impurity region 112a may correspond to a common drain region, and the second impurity regions 112b may correspond to a source region. Each word line 160 and the first and second impurity regions 112a and 112b adjacent thereto may constitute a transistor.

Upper surfaces of the word lines 160 may be lower than an upper surface of the substrate 100. Positions of lower surfaces of the word lines 160 may be determined depending on positions of lower surfaces of the trenches WT. For example, the lower surface of each trench WT may have a different height depending on a type of material constituting the lower surface. For example, among the lower surfaces of the word lines 160, a height of a portion provided on the active regions ACT may be higher than a height of a portion provided on the device isolation pattern 102.

Capping insulating patterns CP may be provided to cover the word lines 160, respectively and extend in a first direction D1. The capping insulating patterns CP may be buried in the trenches WT to cover the upper surface of the word line 160. Sidewalls of the capping insulating patterns CP may be defined by inner walls of the trenches WT and may be aligned with sidewalls of the gate dielectric layer 107. The capping insulating patterns CP may include, for example, a silicon nitride layer or a silicon oxynitride layer.

A buffer insulating layer 105 may be provided on the substrate 100. For example, the buffer insulating layer 105 may include at least one of a silicon oxide layer and/or a silicon nitride layer. Each of the buffer insulating layers 105 may have an island shape spaced apart from each other when viewed in a plan view.

Bit lines BL extending in a second direction D2 crossing the first direction D1 may be provided on the word lines 160. Each of the bit lines BL may be buried in an upper portion of the substrate 100 and connected to the first impurity regions 112a through contact portions DC. The contact portions DC may pass through the bit lines BL and be inserted into the upper portion of the substrate 100, but are not limited thereto, and may be disposed under the bit lines BL.

Bit line capping patterns 137 may be disposed on the bit lines BL, respectively. The bit line capping patterns 137 may include an insulating material such as silicon nitride. A spacer 121 covering both sidewalls of each bit line BL may be provided. The spacer 121 may extend on sidewalls of the bit line capping patterns 137. The spacer 121 may include, for example, at least one of silicon nitride, silicon oxide, and silicon oxynitride. For example, the spacer 121 may include a first spacer layer and a third spacer layer formed of silicon nitride, and a second spacer layer formed of silicon oxide may be provided between the first and third spacer layers. Alternatively, an air gap may be provided instead of the second spacer layer. The spacer 121 may extend in the second direction D2 along the bit line BL. The spacer 121 may extend in the second direction D2 and cover a sidewall of the contact portion DC. The contact portion DC may include doped polycrystalline silicon. The bit lines BL may include, for example, a metal material such as tungsten, titanium, or tantalum.

Contact plugs BC may be disposed between adjacent pair of bit lines BL. The contact plugs BC may include polysilicon or a metal material doped or undoped with impurities. As shown in FIG. 1, the plurality of contact plugs BC may be two-dimensionally spaced apart from each other. For example, the contact plugs BC arranged in the first direction D1 may be spaced apart with bit lines BL interposed therebetween. The contact plugs BC arranged in the second direction D2 may be spaced apart with fence portions 139 interposed therebetween. Upper surfaces of the fence portions 139 may be higher than upper surfaces of the contact plugs BC.

Each of the contact plugs BC may be spaced apart from an adjacent bit line BL with the spacer 121 interposed therebetween. Landing pads LP may be disposed on the contact plugs BC, respectively. The landing pads LP may include a metal-containing material such as tungsten. Each of the landing pads LP may be electrically connected to each of the contact plugs BC. Each of upper portions of the landing pads LP may cover each of upper surfaces of the bit line capping patterns 137 and may have a wider width than that of the contact plug BC. As shown in FIG. 1, centers of the landing pads LP may be shifted from centers of the contact plugs BC in the first direction D1 or in a direction opposite to the first direction D1. Portions of each of the bit lines BL may vertically overlap the landing pads LP. An ohmic layer may be provided between the contact plugs BC and the landing pads LP. The ohmic layer may be a metal silicide layer.

A gap-fill insulating layer GS may be provided to fill spaces between the landing pads LP. The gap-fill insulating layer GS may be provided in a recess region defined by sidewalls of the landing pads LP and sidewalls of the bit line capping patterns 137. When viewed in a plan view, the gap-fill insulating layer GS may have a shape to fill between the two-dimensionally spaced landing pads LP. For example, the gap-fill insulating layer GS may have a substantially mesh planar shape including holes penetrated by the landing pads LP. The gap-fill insulating layer GS may include at least one of a silicon nitride layer and a silicon oxynitride layer.

A data storage unit DS may be provided on each of the landing pads LP. When the semiconductor memory device according to some example embodiments is a DRAM, the data storage unit DS may include a capacitor. For example, the data storage unit DS may include lower electrodes, upper electrodes, and a dielectric layer therebetween.

The word lines 160 are described in more detail with reference to FIGS. 2A, 2B and 3.

Each of the word lines 160 may include a first conductive pattern 161, a second conductive pattern 162, and a third conductive pattern 163 sequentially stacked. The first conductive pattern 161 may be in contact with the gate dielectric layer 107. The first conductive pattern 161 may include metal and/or metal nitride. For example, the first conductive pattern 161 may include at least one of titanium (Ti), tantalum (Ta), tungsten (W), titanium nitride (TiN), tantalum nitride (TaN), and tungsten nitride (WN).

The second conductive pattern 162 may be a metal nitride layer including a diffusion barrier element. When the first conductive pattern 161 includes a first metal element, the second conductive pattern 162 may include the same first metal element as the first conductive pattern 161. An atomic radius of the diffusion barrier element may be smaller than that of the first metal element. The atomic radius of the diffusion barrier element may be greater than that of nitrogen. In this specification, an atomic radius may refer to an atomic radius at standard temperature and pressure. The diffusion barrier element may be, for example, a semiconductor element such as silicon (Si) or germanium (Ge). Alternatively, the diffusion barrier element may be a metal element such as aluminum (Al) or vanadium (V). For example, when the first conductive pattern 161 is a TiN layer including titanium as a first metal element, the second conductive pattern 162 may be a TiSiN layer including titanium which is the first metal element and silicon as a diffusion barrier element. The second conductive pattern 162 may be thinner than each of the first conductive pattern 161 and the third conductive pattern 163. When the diffusion barrier element is silicon, a ratio of the diffusion barrier element in the second conductive pattern 162 may be about 5 at % to about 30 at %. For example, a thickness of the second conductive pattern 162 may be about 3% to about 20% of a thickness of the first conductive pattern 161. For example, the second conductive pattern 162 may have a thickness of about 50 Å to about 150 Å.

The third conductive pattern 163 may have an effective work function smaller than that of the first conductive pattern 161. The third conductive pattern 163 may include metal and/or metal nitride. For example, the third conductive pattern 163 may include at least one of titanium (Ti), tantalum (Ta), tungsten (W), titanium nitride (TiN), tantalum nitride (TaN), and tungsten nitride (WN). The third conductive pattern 163 may further include a work function adjustment element. The work function adjustment elements may be a metal element such as lanthanum (La), strontium (Sr), antimony (Sb), yttrium (Y), aluminum (Al), tantalum (Ta), hafnium (Hf), iridium (Ir), zirconium (Zr), or magnesium (Mg). However, examples of the work function adjustment element are not limited thereto. Due to the work function adjustment element, an effective work function of the third conductive pattern 163 may be small even when the first conductive pattern 161 and the third conductive pattern 163 are the same metal nitride layer. For example, the third conductive pattern 163 may be a metal nitride layer including the same first metal element as the first conductive pattern 161. A concentration of the work function adjustment element in the third conductive pattern 163 may be about 2 at % to about 7 at %. Resistivity of the second conductive pattern 162 may be greater than those of the first conductive pattern 161 and the third conductive pattern 163. The second conductive pattern 162 may cover a lower surface and a sidewall of the third conductive pattern 163.

A grain size, for example an average grain size determined by an intercept procedure, of the second conductive pattern 162 may be smaller than that of the first conductive pattern 161 and smaller than that of the third conductive pattern 163. The relatively small grain size of the second conductive pattern 162 may be attributed to the diffusion barrier element. For example, diffusion barrier element may serve as an additional nucleation site when the second conductive pattern 162 is formed, and as a result, the grain size of the second conductive pattern 162 may be reduced. In addition, due to the aforementioned atomic radius of the diffusion barrier element, an atomic packing factor of the second conductive pattern 162 may be greater than those of the first conductive pattern 161 and the third conductive pattern 163 that do not include the diffusion barrier element. The diffusion barrier element may be segregated at a grain boundary of the second conductive pattern 162 to alleviate an increase in grain size of the second conductive pattern 162 due to heat treatment.

Due to the relatively small grain size, the second conductive pattern 162 may limit or prevent the work function adjustment element in the third conductive pattern 163 from diffusing into the first conductive pattern 161. That is, a diffusion path of the work function adjustment element may be relatively increased by the diffusion barrier element, and as a result, diffusion of the work function adjustment element into the first conductive pattern 161 may be limited or prevented. Accordingly, it may be possible to limit or prevent the work function of the first conductive pattern 161 from being changed, due to the work function adjustment element.

A concentration of the work function adjustment element in the third conductive pattern 163 may gradually decrease from an upper surface 163_T to a lower surface 163_B. A upper surface 162_T of the second conductive pattern 162 and the upper surface 163_T of the third conductive pattern 163 may be at the same or substantially the same level. A concentration of the work function adjustment element in the second conductive pattern 162 may gradually decrease from the upper surface 162_T to a lower surface thereof. Due to the characteristics of the second conductive pattern 162 described above, a concentration of the work function adjustment element in the second conductive pattern 162 may be smaller than a concentration of the work function adjustment element in the third conductive pattern 163 in a lower region BP where a lower portion of the third conductive pattern 163 and a lower portion of the second conductive pattern 162 are disposed. For example, a concentration of lanthanum (La) in the lower portion of the second conductive pattern 162 may be smaller than a concentration of lanthanum (La) in the lower portion of the third conductive pattern 163. For example, at a level of the lower surface 163_B of the third conductive pattern 163, a concentration of the work function adjustment element in the second conductive pattern 162 may be smaller than a concentration of the work function adjustment element in the third conductive pattern 163. For example, at a level of the lower surface 163_B of the third conductive pattern 163, a concentration of the work function adjustment element in the second conductive pattern 162 may be substantially zero. Similarly, at a height of half a thickness of the third conductive pattern 163, a concentration of the work function adjustment element in the second conductive pattern 162 may be smaller than a concentration of the work function adjustment element in the third conductive pattern 163.

According to an example embodiment of some inventive concepts, the second conductive pattern 162 that limits or prevents diffusion of the work function adjustment element may be provided between the first conductive pattern 161 and the third conductive pattern 163 including different work functions, thereby limiting or preventing unintentional change of the work function of the first conductive pattern 161.

FIGS. 4A to 9A are cross-sectional views illustrating a method of manufacturing a semiconductor memory device according to example embodiments of some inventive concepts, and are cross-sectional views taken along lines A1-A2 and B1-B2 of FIG. 1. FIGS. 4B to 9B are cross-sectional views illustrating a method of manufacturing a semiconductor memory device according to some example embodiments of the inventive concepts, and are cross-sectional views taken along line C1-C2 of FIG. 1.

Figure 4A:
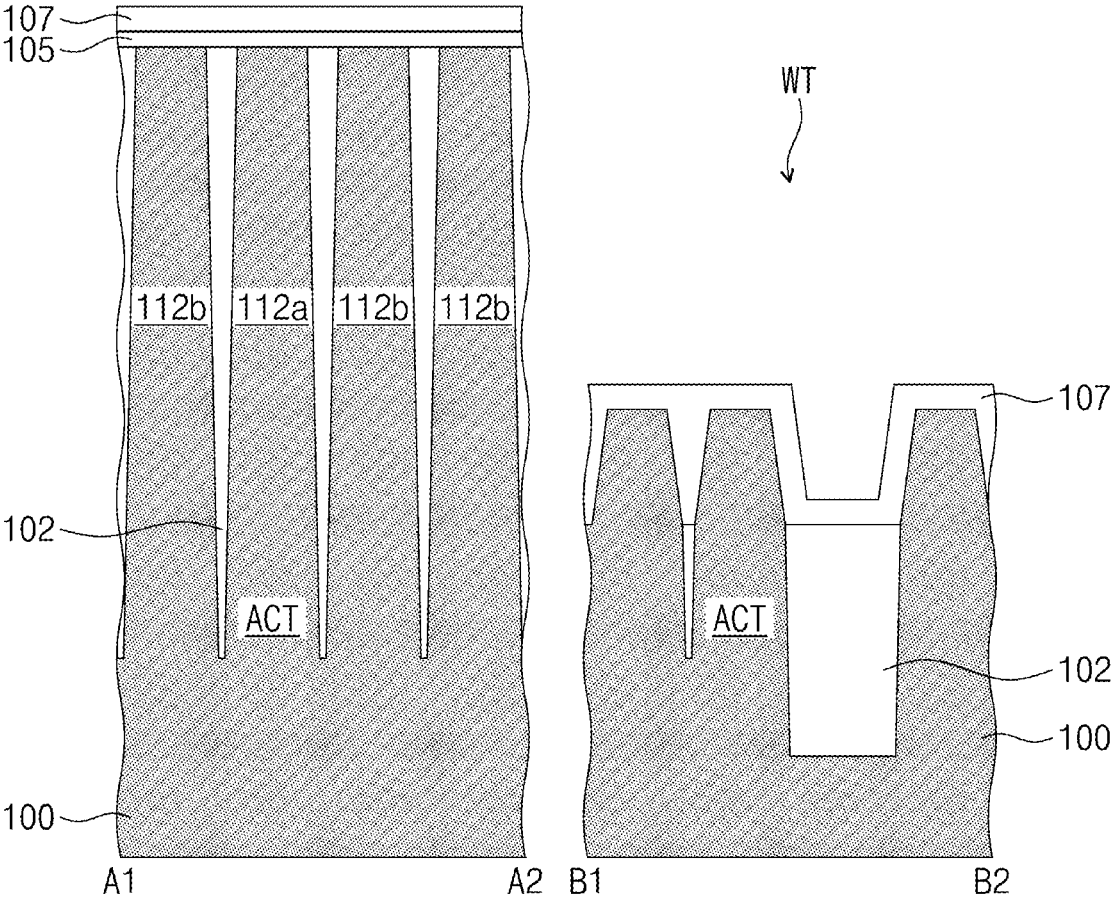
Figure 4B:
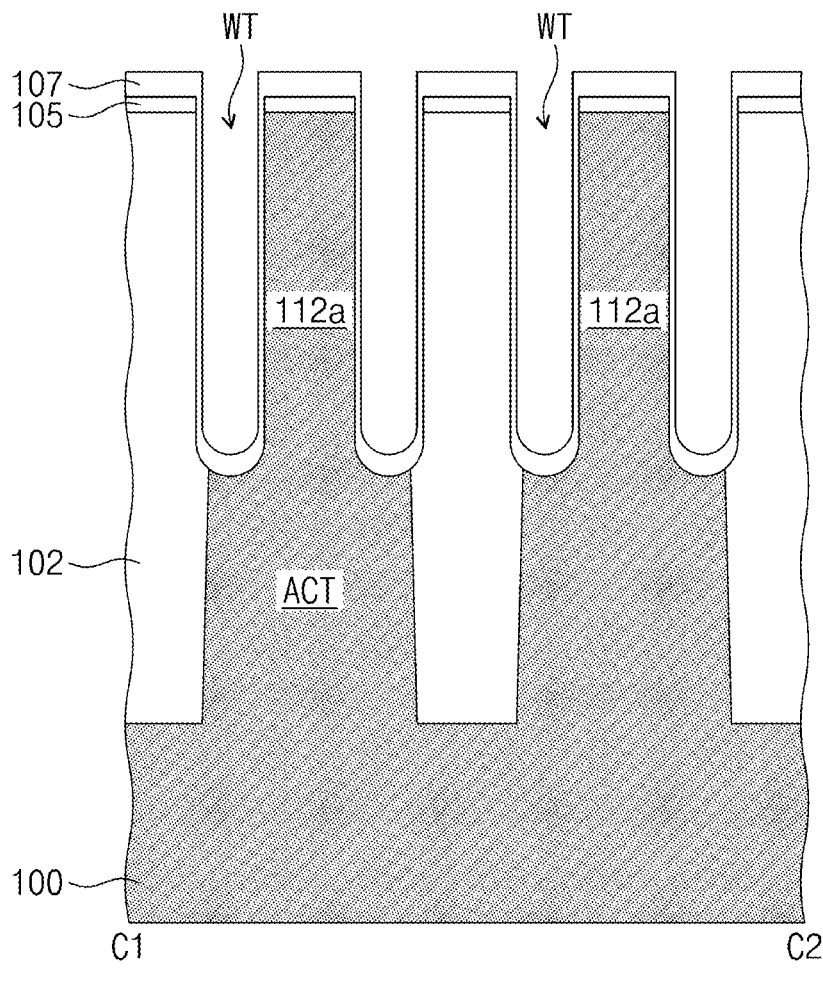

Referring to FIGS. 1, 4A and 4B, device isolation patterns 102 may be formed on a substrate 100 to define active regions ACT. For example, grooves may be formed in the substrate 100 and the grooves may fill with an insulating material to form the device isolation pattern 102. A depth of the device isolation pattern 102 may be different depending on a distance between the active regions ACT. For example, the device isolation pattern 102 may be formed of silicon oxide.

A buffer insulating layer 105 may be formed on the substrate 100 on which the device isolation pattern 102 is formed. For example, the buffer insulating layer 105 may be formed of at least one of a silicon oxide layer and/or a silicon nitride layer, but example embodiments are not limited thereto Impurities may be implanted into the active regions ACT. Accordingly, first and second impurity regions 112a and 112b may be formed in the active regions ACT. The first and second impurity regions 112a and 112b may have a conductivity type different from that of the substrate 100. For example, when the substrate 100 has a p-type conductivity, each of the first and second impurity regions 112a and 112b may have an n-type conductivity.

After forming a mask pattern, an etching process using the mask pattern may be performed to form trenches WT on an upper portion of the substrate 100. Each of the trenches WT may extend in a first direction D1. The trenches WT may pass through the buffer insulating layer 105 and extend into the device isolation pattern 102 and the upper portion of the substrate 100. Lower surfaces of the trenches WT may be formed to have different heights depending on materials defining the lower surfaces. For example, the device isolation pattern 102 may be etched faster than the substrate 100.

A gate dielectric layer 107 may be formed to cover the trenches WT. The gate dielectric layer 107 may be formed through a thermal oxidation process, a chemical vapor deposition process, and/or an atomic layer deposition process, but example embodiments are not limited thereto.

Figure 5A:
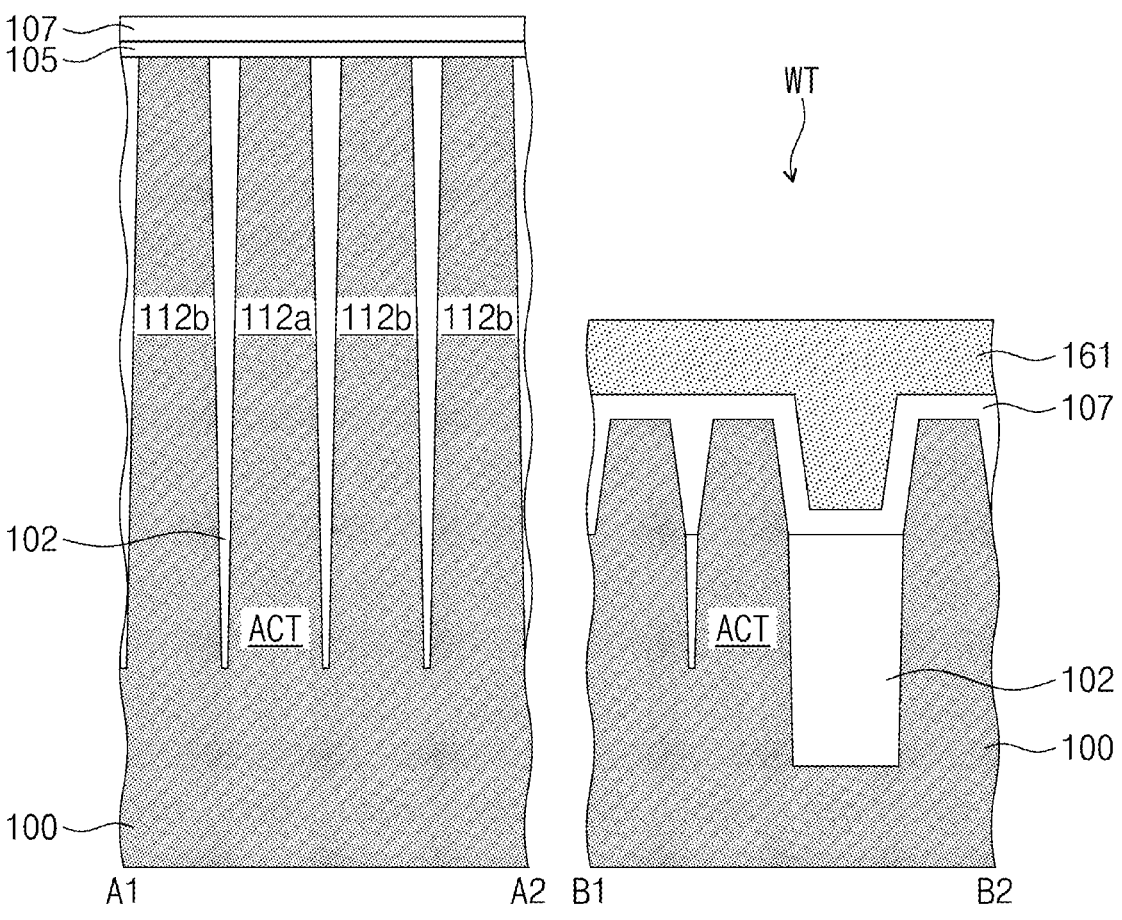
Figure 5B:
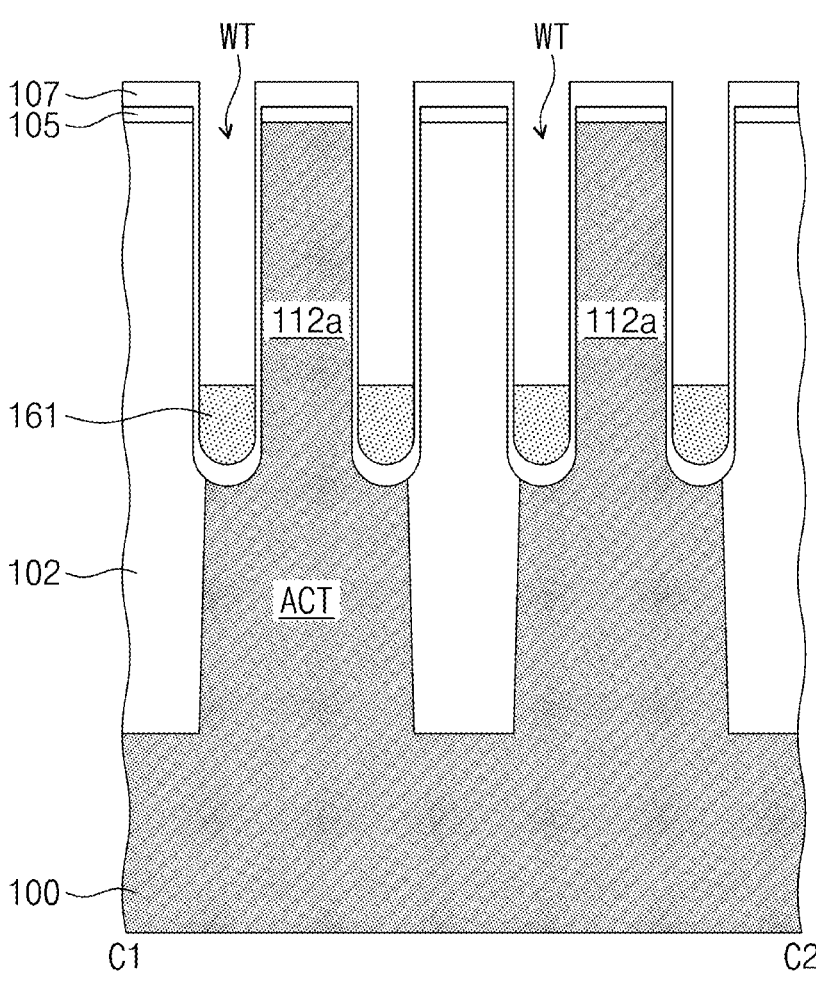

Referring to FIGS. 1, 5A and 5B, a first conductive pattern 161 may be formed on the gate dielectric layer 107. The first conductive pattern 161 may be formed through an atomic layer deposition (ALD) process. The first conductive pattern 161 may include a first metal element and nitrogen. For example, the first conductive pattern 161 may include a TiN layer, and a composition ratio of titanium to nitrogen of the first conductive pattern 161 may be about 0.7 or more and less than 1.0. The composition of the first conductive pattern 161 may be formed by adjusting the number of injection cycles of a first metal element source gas and a nitrogen source gas in the ALD process. For example, the source gas of the first metal element may be TiCl4, and the source gas of nitrogen may be NH3. Forming the first conductive pattern 161 may include an etch-back process. Accordingly, the first conductive patterns 161 may be separated from each other in lower portions of the trenches WT.

Figure 6A:
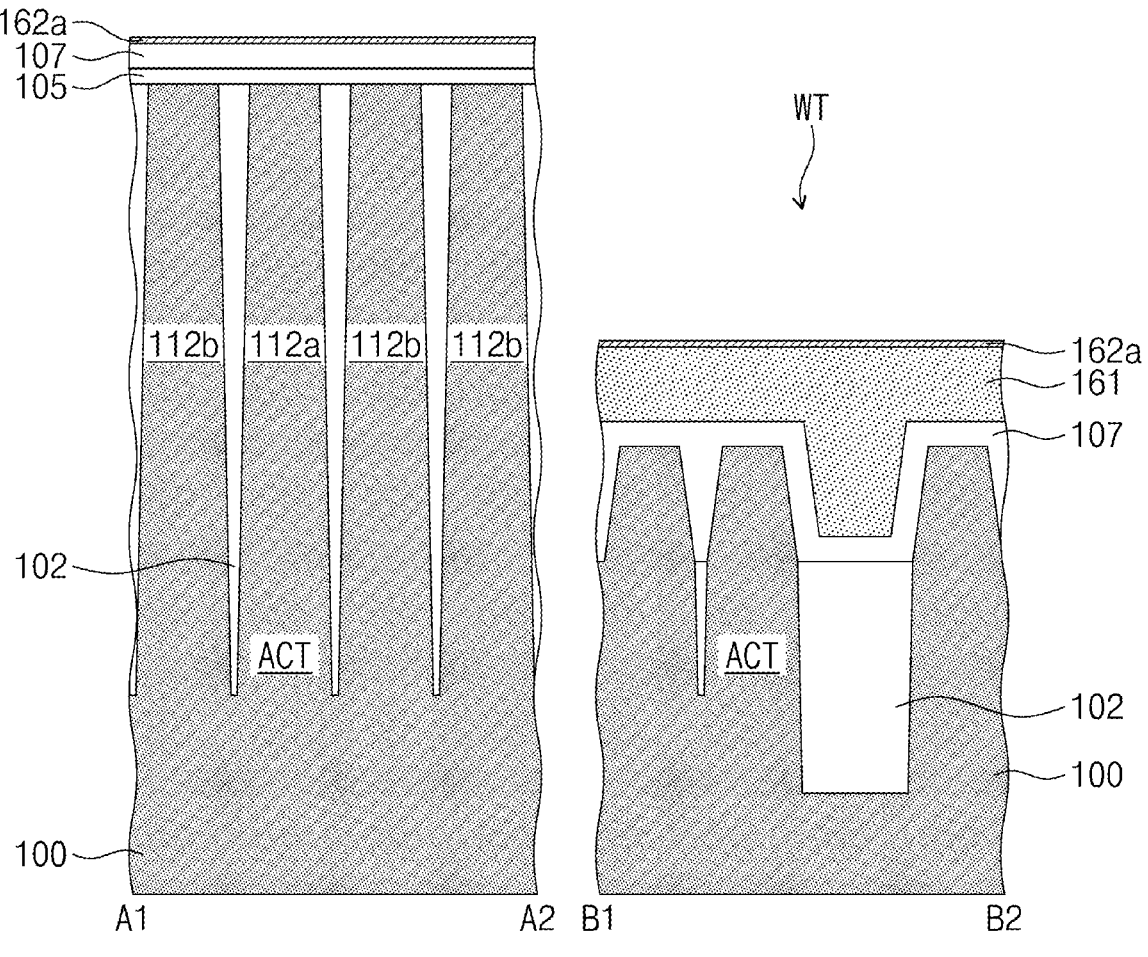
Figure 6B:
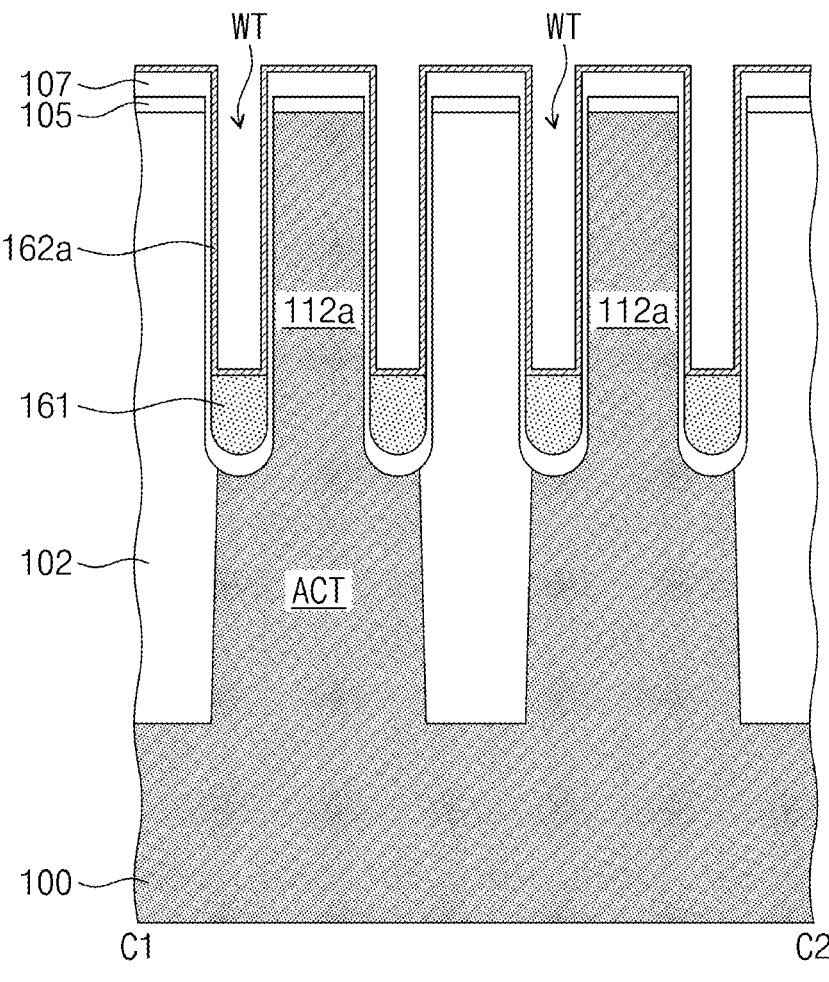

Referring to FIGS. 1, 6A and 6B, a preliminary second conductive pattern 162a may be formed on the first conductive pattern 161. The preliminary second conductive pattern 162a may be formed by an ALD process in the same process chamber as the first conductive pattern 161.

Similar to the first conductive pattern 161, the preliminary second conductive pattern 162a may be formed by repeating an injection cycle of the first metal element and nitrogen source gases. Forming the preliminary second conductive pattern 162a may include supplying a source of a diffusion barrier element. Supplying the diffusion barrier element may be performed in-situ. The diffusion barrier element may be supplied together with the source gases of the first metal element and nitrogen, or may be supplied after the supplying the source gases of the first metal element and nitrogen. For example, when the diffusion barrier element is silicon, a silicon source may be at least one of $SiH_4$, $SiH_3Cl$, $SiH_2Cl_2$, $HSiCl_3$, $SiCl_4$, $Si_2H_6$, $Si_2Cl_6$ (hexachlorodisilane, HCDS), $SiC_6H_{17}N$ (diisopropylaminosilane, DIPAS), Tri(dimetrylamino)silane (TDMAS), $(N(CH_3)_2)_3$ (His), Bis(dietylamino)silane (BDEAS), $(N(C_2H_5)_2)_2(H_2Si)$, but example embodiments are not limited thereto The preliminary second conductive pattern 162a may be formed thinner than the first conductive pattern 161.

Figure 7A:
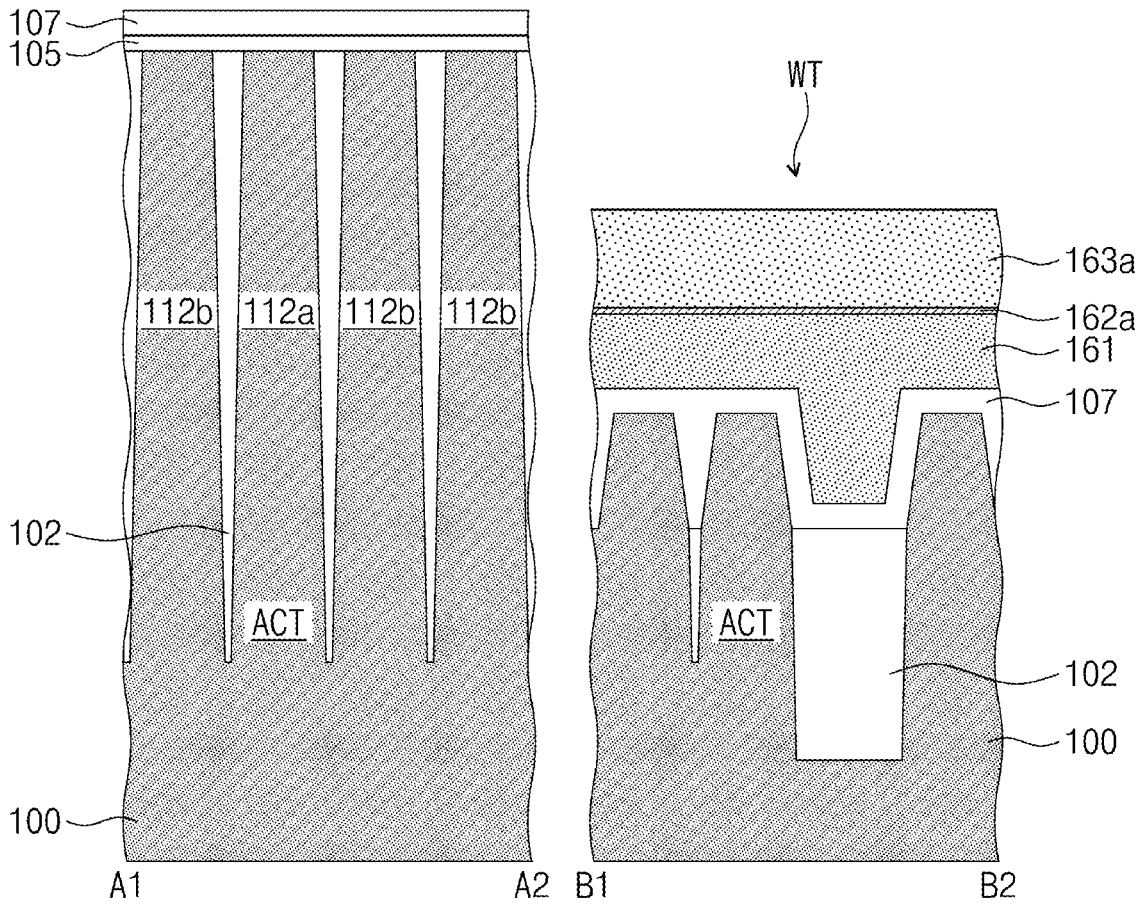
Figure 7B:
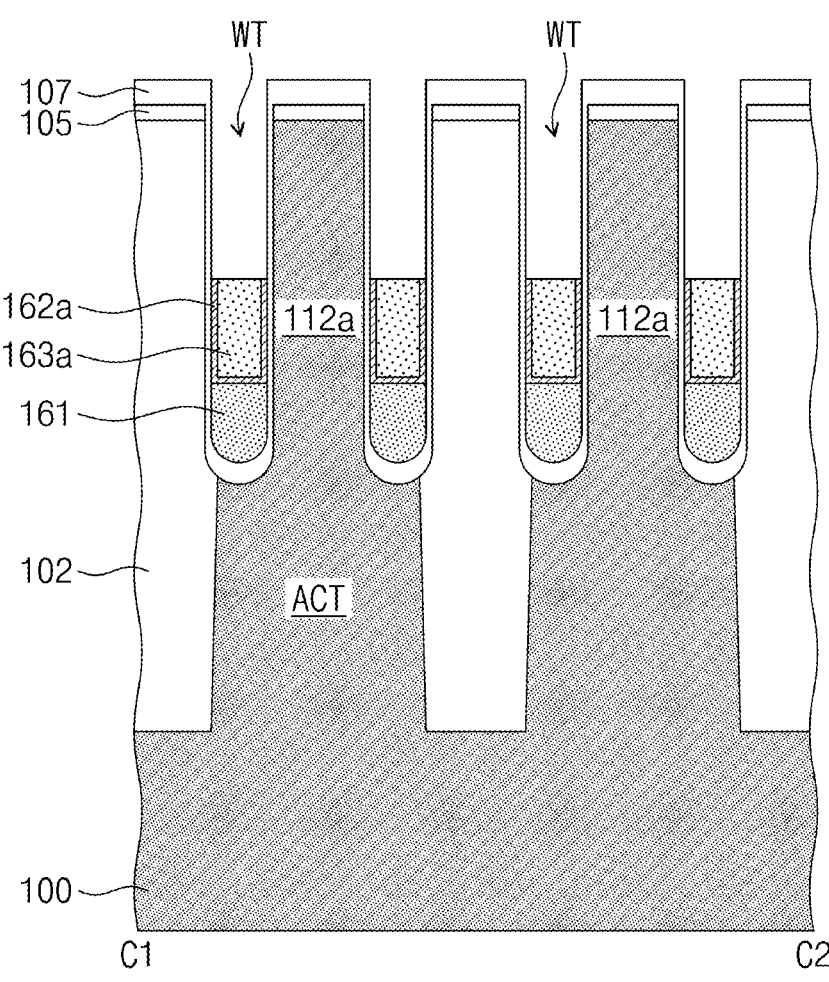

Referring to FIGS. 1, 7A, and 7B, a preliminary third conductive pattern 163a may be formed on the preliminary second conductive pattern 162a. The preliminary third conductive pattern 163a may be formed by an ALD process in the same process chamber as the first conductive pattern

9

161. Similar to the first conductive pattern 161, the preliminary third conductive pattern 163a may be formed by repeating an injection cycle of the source gases of the first metal element and nitrogen. The preliminary third conductive pattern 163a may be formed with the same, substantially the same, or higher ratio of the first metal element in the first conductive pattern 161. For example, the preliminary third conductive pattern 163a may include a TiN layer. Forming the preliminary third conductive pattern 163a may include an etch-back process. Accordingly, each of the preliminary third conductive pattern 163a and the preliminary second conductive pattern 162a may be separated in the lower portions of the trenches WT.

Figure 8A:
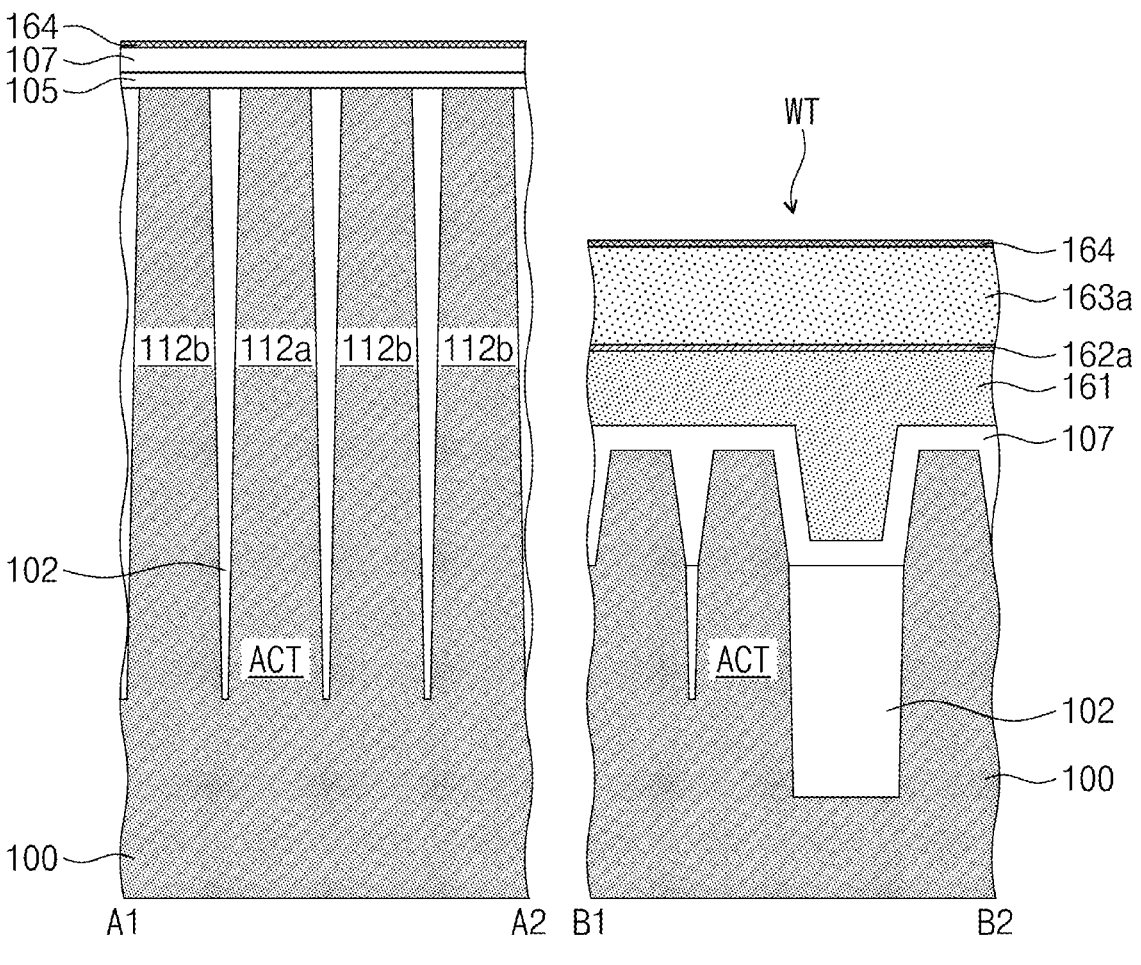
Figure 8B:
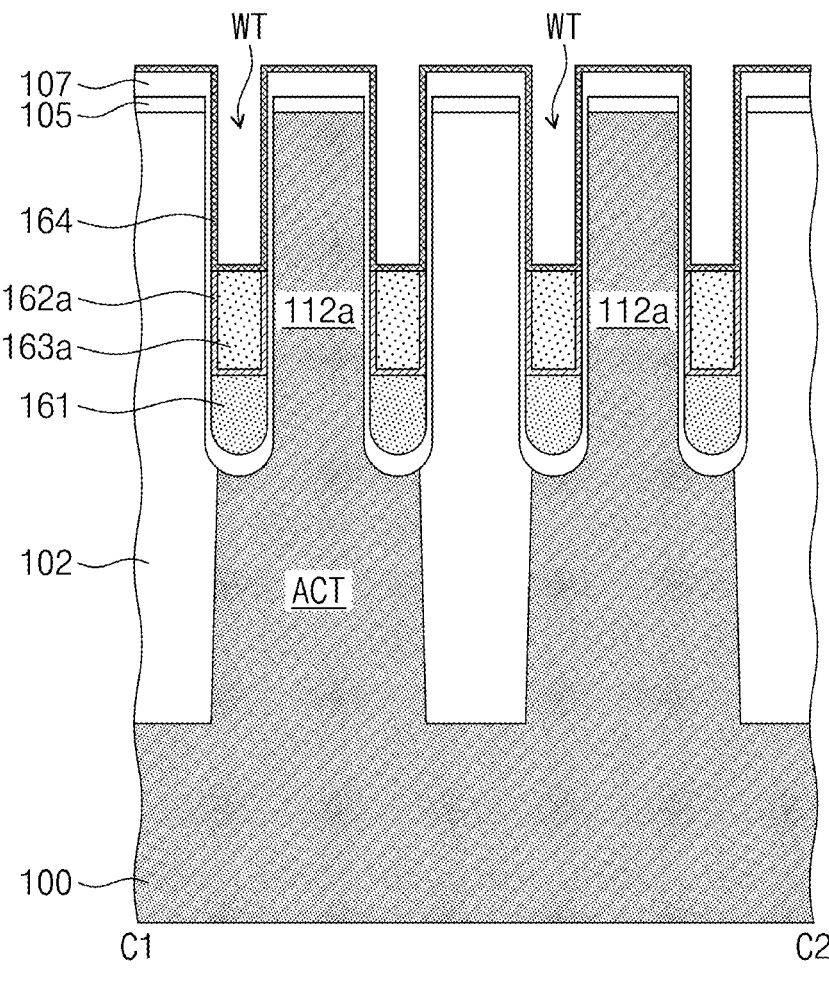

Referring to FIGS. 1, 8A, and 8B, a work function adjustment layer 164 may be formed to cover upper surfaces of the preliminary third conductive pattern 163a and the preliminary second conductive pattern 162a. The work function adjustment layer 164 may be an oxide layer of the above-described work function elements, such as lanthanum oxide (LaO), or a metal layer. The work function adjustment layer 164 may be formed by ALD, but is not limited thereto.

Figure 9A:
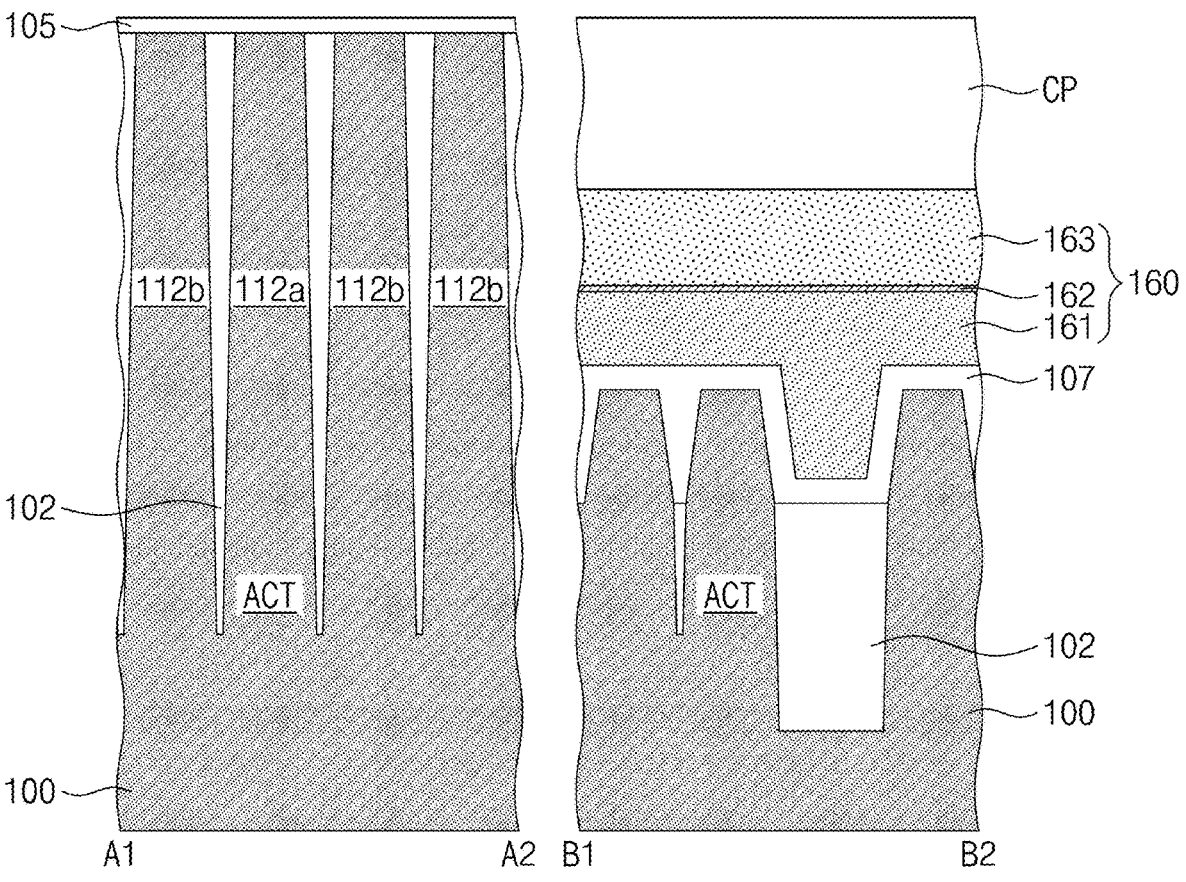
Figure 9B:
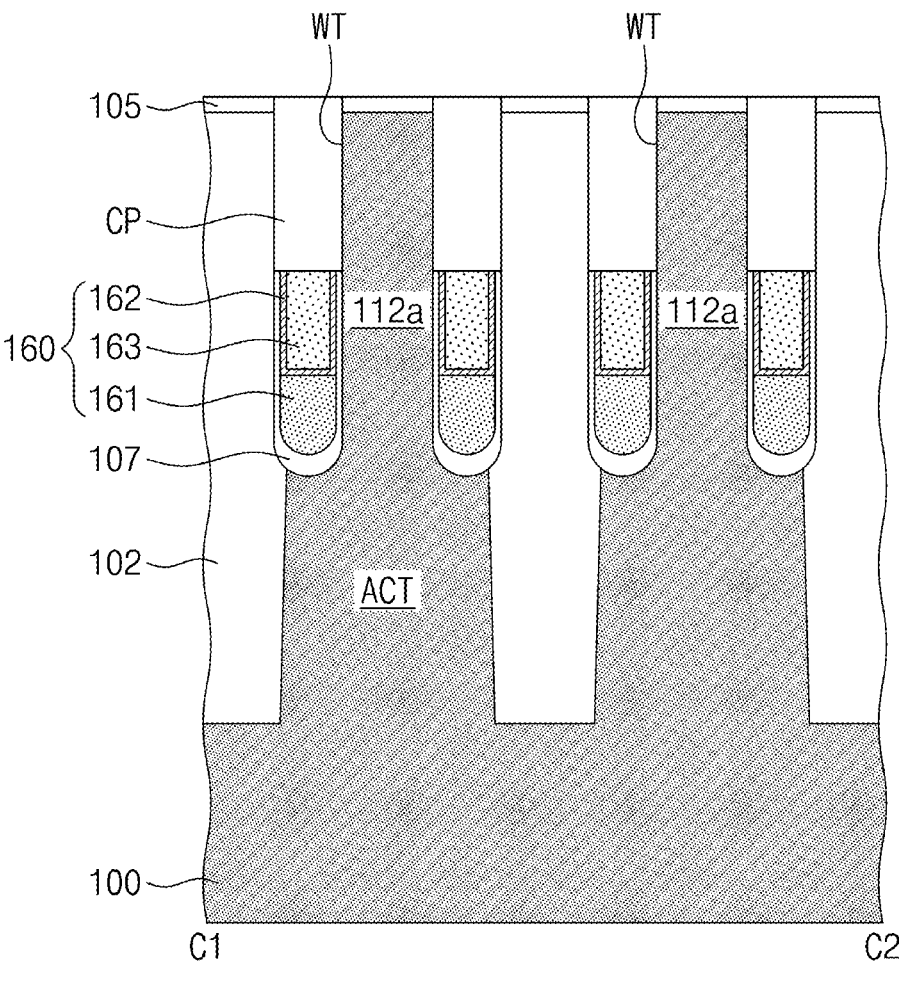

Referring to FIGS. 1, 9A, and 9B, a work function adjustment layer from a work function adjustment layer 164 may diffuse into the preliminary third conductive pattern 163a and the preliminary second conductive pattern 162a. Accordingly, forming word lines 160 including the first conductive pattern 161, a second conductive pattern 162, and a third conductive pattern 163 may be completed. Diffusing the work function adjustment element may be performed naturally at a deposition temperature of the work function adjustment layer 164 with an additional heat treatment process or without an additional heat treatment process. A distribution profile of the work function adjustment element may be determined by diffusion, as described above, and thus a concentration may decrease from an upper portion to a lower portion of the third conductive pattern 163, and from an upper portion to a lower portion of the second conductive pattern 162. After the diffusion of the work function adjustment element through the work function adjustment layer 164 is finished, a portion of the work function adjustment layer 164 remaining may be removed. The gate dielectric layer 107 may be separated from each other in the lower portions of the trenches WT.

Capping insulating patterns CP may be formed on upper portions of the trenches WT. The capping insulating patterns CP may be formed, for example, of a silicon nitride layer or a silicon oxynitride layer. The capping insulating patterns CP may be formed through a chemical vapor deposition process. For example, forming the capping insulating patterns CP may include forming an insulating layer and performing a planarization process. For example, performing the planarization process may be a chemical mechanical polishing process. The buffer insulating layer 105 may be exposed by the planarization process.

Referring back to FIGS. 1, 2A and 2B, bit lines BL, contact portions DC, and bit line capping patterns 137 may be formed. The bit lines BL may be formed of at least one of tungsten, titanium, and tantalum, but example embodiments are not limited thereto After the bit line capping patterns 137 are formed an etching process may be performed using the bit line capping patterns 137 as a mask to form the bit lines BL. For example, the bit line capping patterns 137 may be formed of an insulating material such as silicon nitride. A spacer 121 may be formed to cover sidewalls of the bit line BL and sidewalls of the bit line capping patterns 137. For example, the spacer 121 may be formed of silicon nitride.

After fence portions 139 between the bit lines BL extending in a second direction D2 are formed, regions defined by the bit lines BL and the fence portions 139 may be etched to expose the second impurity regions 112b. Contact plugs BC connected to the exposed second impurity regions 112b may be formed. The contact plugs BC may be formed of polysilicon or a metal material doped or undoped with impurities.

After a landing pad layer is formed on the contact plugs BC, an anisotropic etching process may be performed to form landing pads LP separated from each other. The landing pads LP may include, for example, tungsten. A gap-fill insulating layer GS may be formed to fill between the landing pads LP separated from each other. The gap-fill insulating layer GS may be formed of at least one of a silicon nitride layer and a silicon oxynitride layer.

An data storage unit DS may be formed on each of the landing pads LP. For example, after lower electrodes are formed on each of the landing pads LP, a dielectric layer and an upper electrode sequentially covering the lower electrodes may be formed.

According to the some example embodiments of the inventive concepts, the work function adjustment element may be limited or prevented from being diffused into the first conductive pattern, thereby limiting or preventing the work function of the first conductive pattern from being unintentionally changed.

Figure 10A:
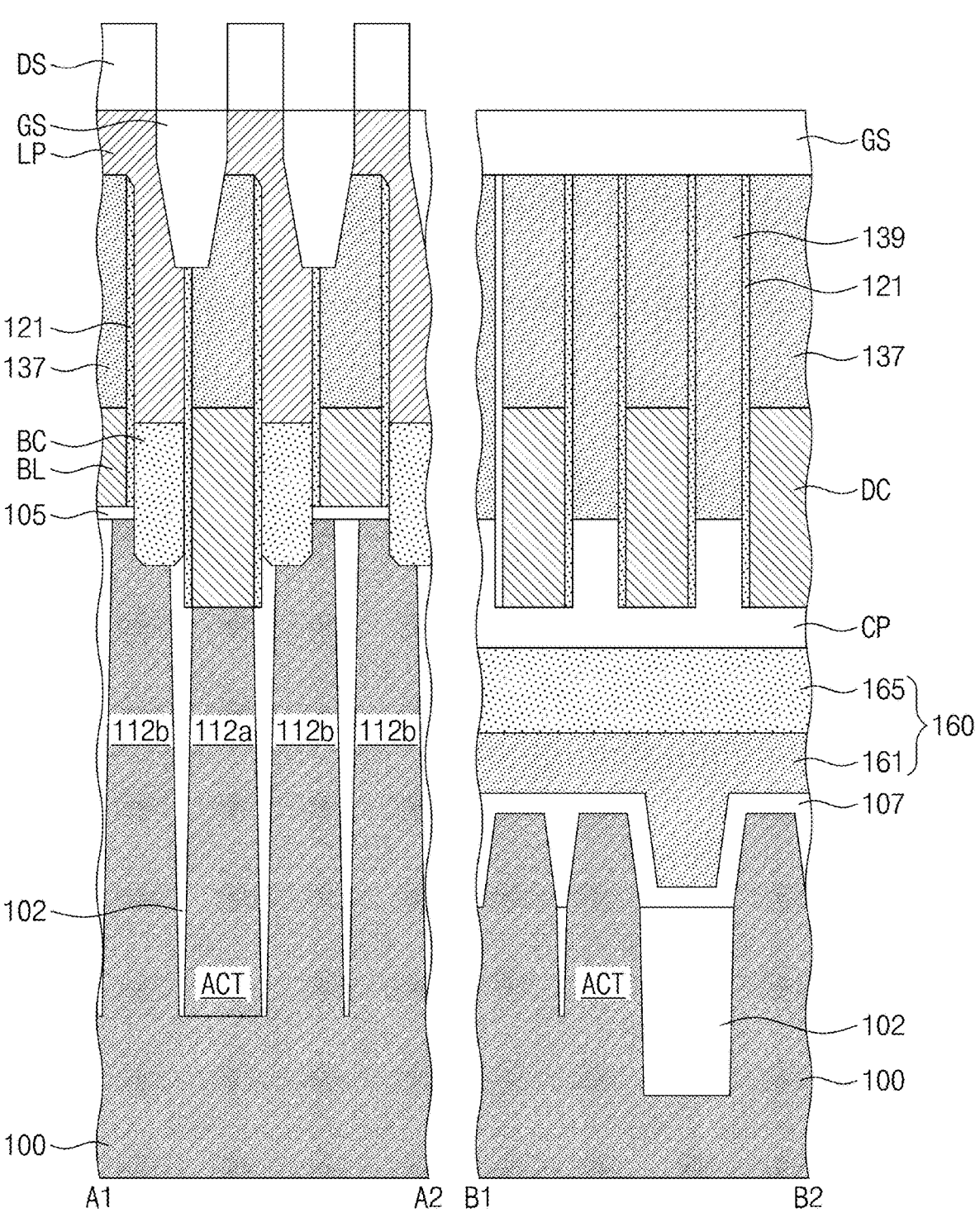
FIG. 10A is a cross-sectional view along lines A1-A2 and B1-B2 of FIG. 1 according to some example embodiments of the inventive concepts.
Figure 10B:
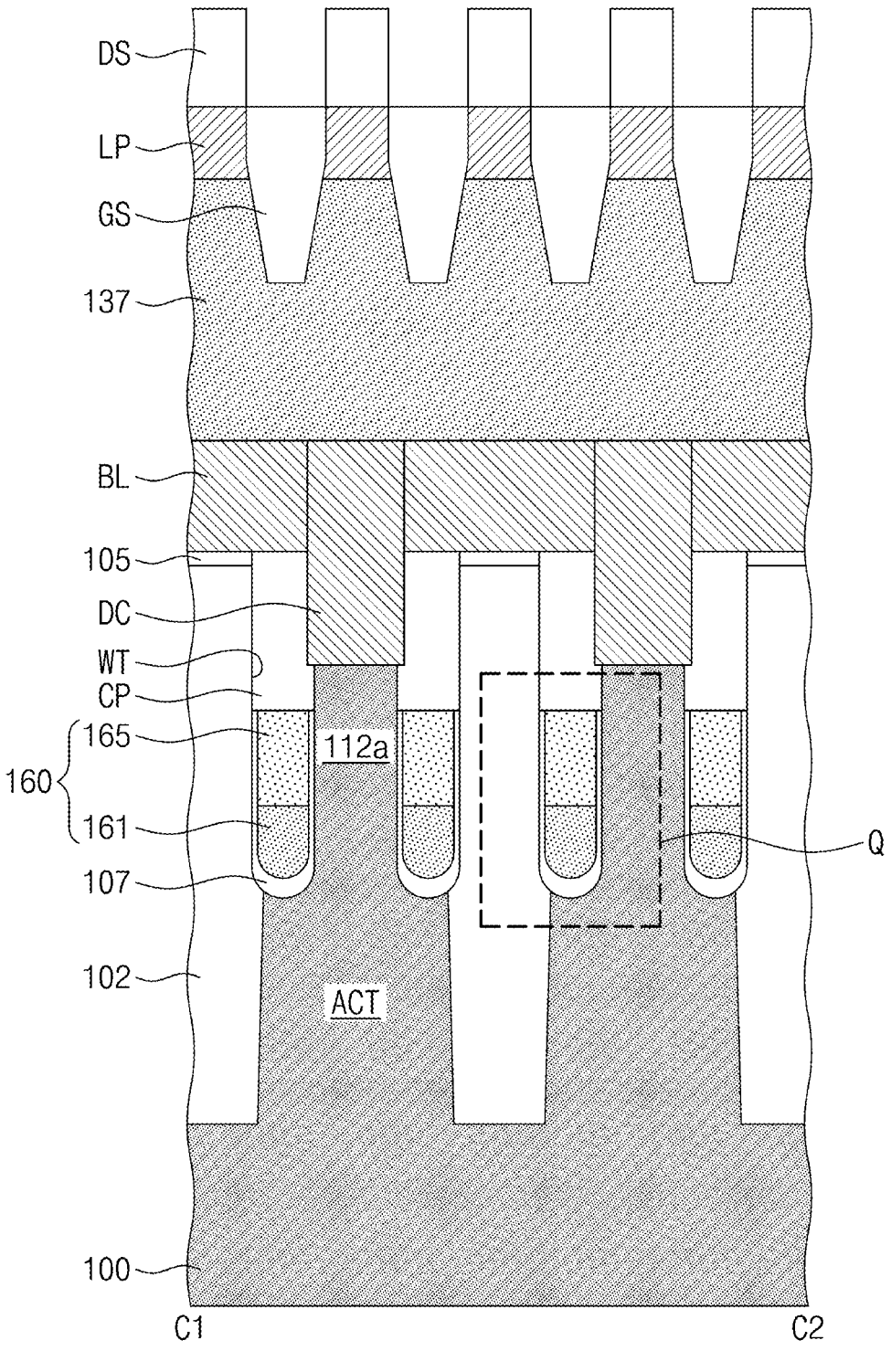
FIG. 10B is a cross-sectional view taken along line C1-C2 of FIG. 1 according to some example embodiments of the inventive concepts.
Figure 10C:
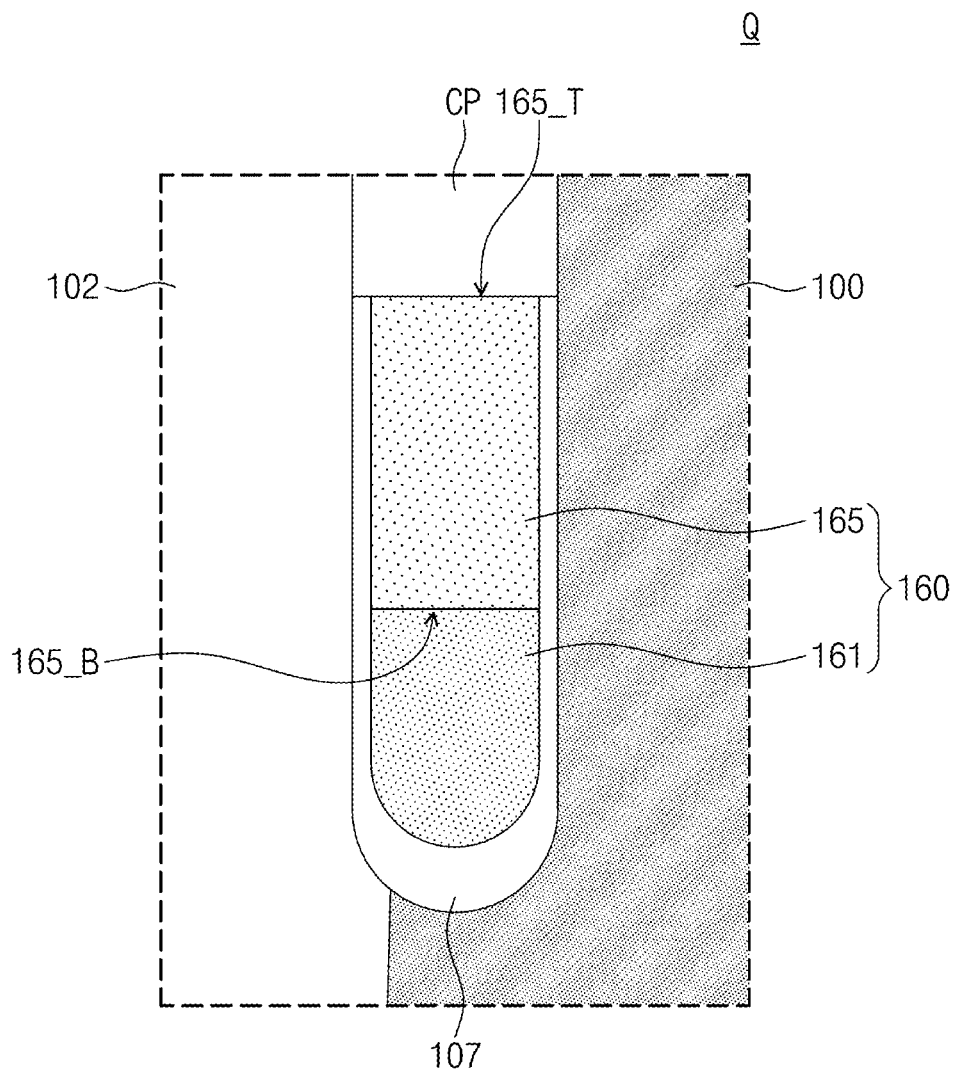
FIG. 10C is an enlarged view of region 'Q' of FIG. 10B.

FIG. 10A is a cross-sectional view along lines A1-A2 and B1-B2 of FIG. 1 according to some example embodiments of the inventive concepts. FIG. 10B is a cross-sectional view taken along line C1-C2 of FIG. 1 according to example embodiments of the inventive concepts. FIG. 10C is an enlarged view of region 'Q' of FIG. 10B. For simplicity of description, descriptions of overlapping configurations may be omitted.

Referring to FIGS. 10A, 10B, and 10C, each word line 160 may include a first conductive pattern 161 and a second conductive pattern 165 sequentially stacked. The first conductive pattern 161 may be in contact with the gate dielectric layer 107. The first conductive pattern 161 may include metal and/or metal nitride. For example, the first conductive pattern 161 may include at least one of titanium (Ti), tantalum (Ta), tungsten (W), titanium nitride (TiN), tantalum nitride (TaN), and tungsten nitride (WN).

A sidewall of the second conductive pattern 165 may be in contact with the gate dielectric layer 107. The second conductive pattern 165 may be a metal nitride layer including a diffusion barrier element. When the first conductive pattern 161 includes the first metal element, the second conductive pattern 165 may include the same first metal element as the first conductive pattern 161. An atomic radius of the diffusion barrier element may be smaller than that of the first metal element. The atomic radius of the diffusion barrier element may be greater than that of nitrogen. The diffusion barrier element may be a semiconductor element such as silicon or germanium. Alternatively, the diffusion barrier element may be, for example, a metal element such as aluminum (Al) or vanadium (V). For example, when the first conductive pattern 161 is a TiN layer including titanium as a first metal element, the second conductive pattern 165 may be a TiSiN layer including titanium as the first metal element and silicon as a diffusion barrier element. A ratio of the diffusion barrier element in the second conductive pattern 165 may be about 5 at % to about 30 at %. Resistivity of the second conductive pattern 162 may be greater than that of the first conductive pattern 161.

The second conductive pattern 165 may have a smaller effective work function than that of the first conductive pattern 161. The second conductive pattern 165 may further include a work function adjustment element. The work function adjustment element may be a metal element such as lanthanum (La), strontium (Sr), antimony (Sb), yttrium (Y), aluminum (Al), tantalum (Ta), hafnium (Hf), iridium (Ir), zirconium (Zr), or magnesium (Mg). However, example embodiments of work function adjustment element are not limited thereto. A concentration of the work function adjustment element in the second conductive pattern 165 may be about 2 at % to about 7 at %. The concentration of the work function adjustment element in the second conductive pattern 165 may gradually decrease from an upper surface 165_T to a lower surface 165_B.

A grain size of the second conductive pattern 165 may be smaller than that of the first conductive pattern 161. The relatively small grain size of the second conductive pattern 165 may be due to the diffusion barrier element. Due to the relatively small grain size, the second conductive pattern 165 may limit or prevent the work function adjustment element from an upper portion thereof from being excessively diffused to an lower portion thereof and, as a result, may limit or prevent the work function adjustment element from being diffused into the first conductive pattern 161. Accordingly, the work function of the first conductive pattern 161 may be limited or prevented from being changed, due to the work function adjustment element.

According to an example embodiment of the inventive concepts, the work function adjustment element may be limited or prevented from diffusing into the first conductive pattern, thereby limiting or preventing the work function of the first conductive pattern from being unintentionally changed.

FIGS. 11A to 13A are cross-sectional views illustrating a method of manufacturing a semiconductor memory device according to some example embodiments, and are cross-sectional views taken along lines A1-A2 and B1-B2 of FIG. 1. FIGS. 11B to 13B are cross-sectional views illustrating a method of manufacturing a semiconductor memory device according to some example embodiments, and are cross-sectional views taken along line C1-C2 of FIG. 1. For simplicity of description, descriptions of overlapping configurations may be omitted.

Figure 11A:
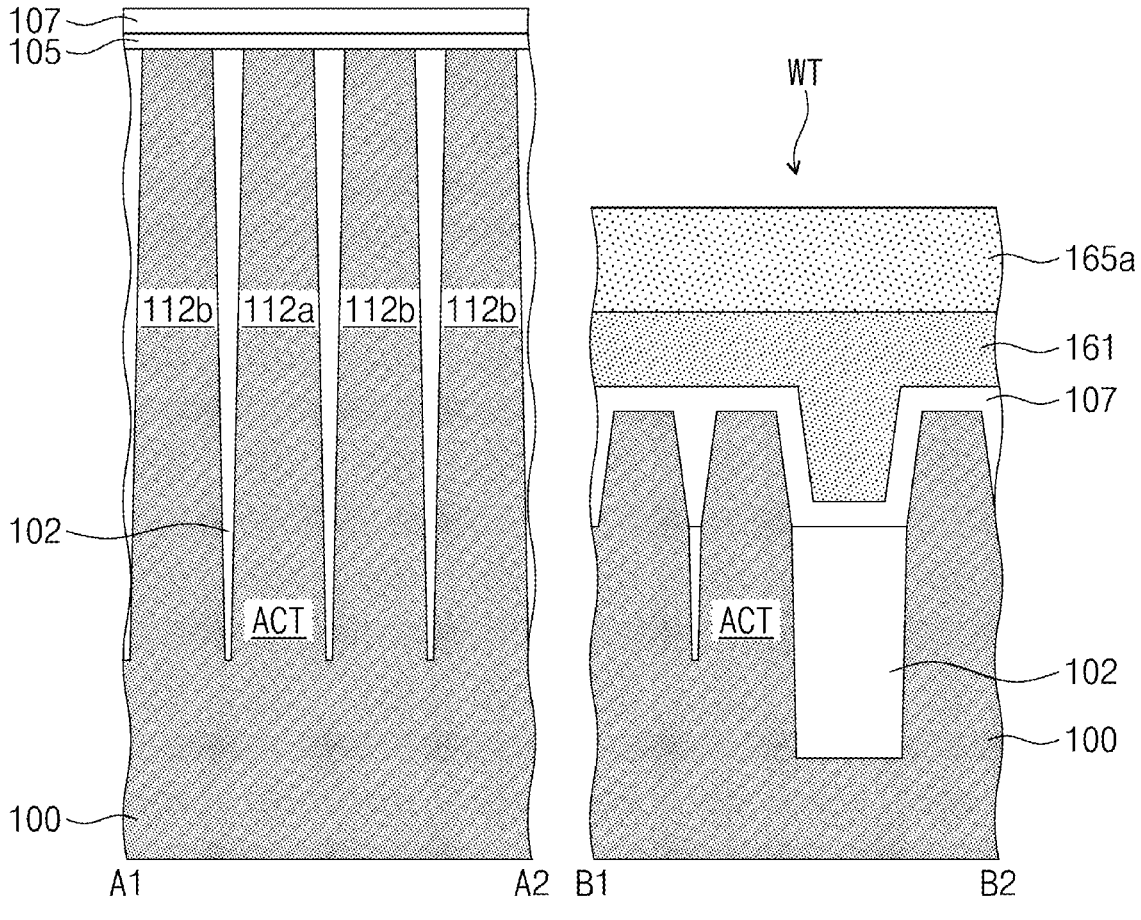
Figure 11B:
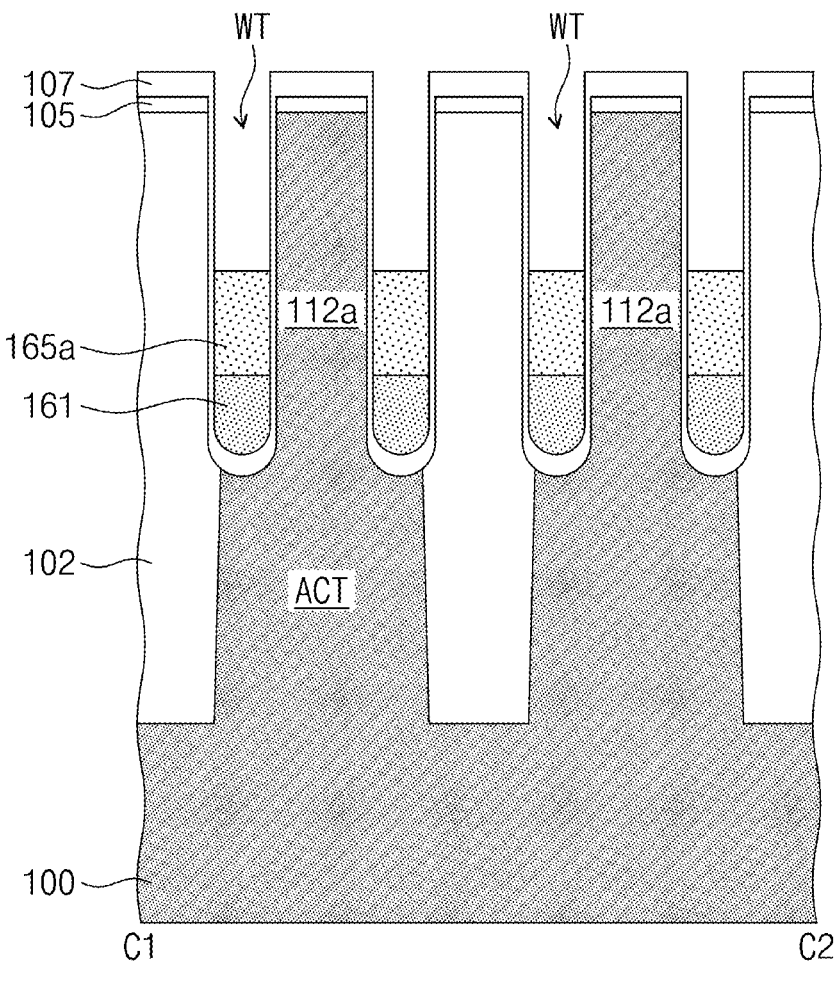

Referring to FIGS. 1, 11A and 11B, a first conductive pattern 161 may be formed on the gate dielectric layer 107. The first conductive pattern 161 may be formed through an atomic layer deposition (ALD) process. The first conductive pattern 161 may include a first metal element and nitrogen. For example, the first conductive pattern 161 may include a TiN layer, and forming the first conductive pattern 161 may include an etch-back process. Accordingly, the first conductive patterns 161 may be separated from each other in lower portions of the trenches WT.

A preliminary second conductive pattern 165a may be formed on the first conductive pattern 161. The preliminary second conductive pattern 165a may be formed by an ALD process in the same process chamber as the first conductive pattern 161.

Similar to the first conductive pattern 161, the preliminary second conductive pattern 165a may be formed by repeating an injection cycle of source gases of first metal element and nitrogen. Forming the preliminary second conductive pattern 165a may include supplying a source of a diffusion barrier element. The diffusion barrier element may be performed in-situ. The diffusion barrier element may be, for example, supplied together with the source gases of the first metal element and nitrogen, or may be supplied after the supply of the source gases of the first metal element and nitrogen. Forming the preliminary second conductive pattern 165a may include an etch-back process. Accordingly, the preliminary second conductive patterns 165a may be separated from each other in the lower portions of the trenches WT.

Figure 12A:
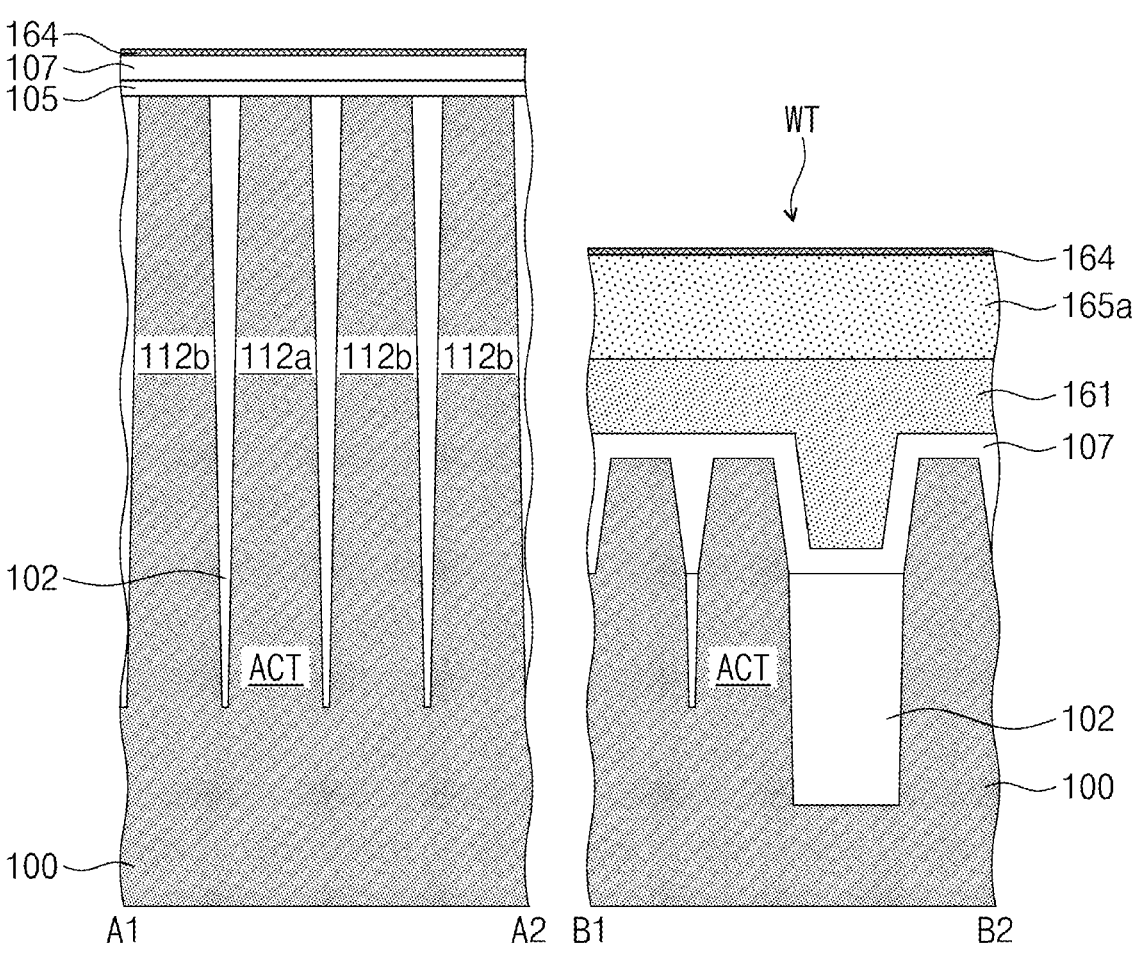
Figure 12B:
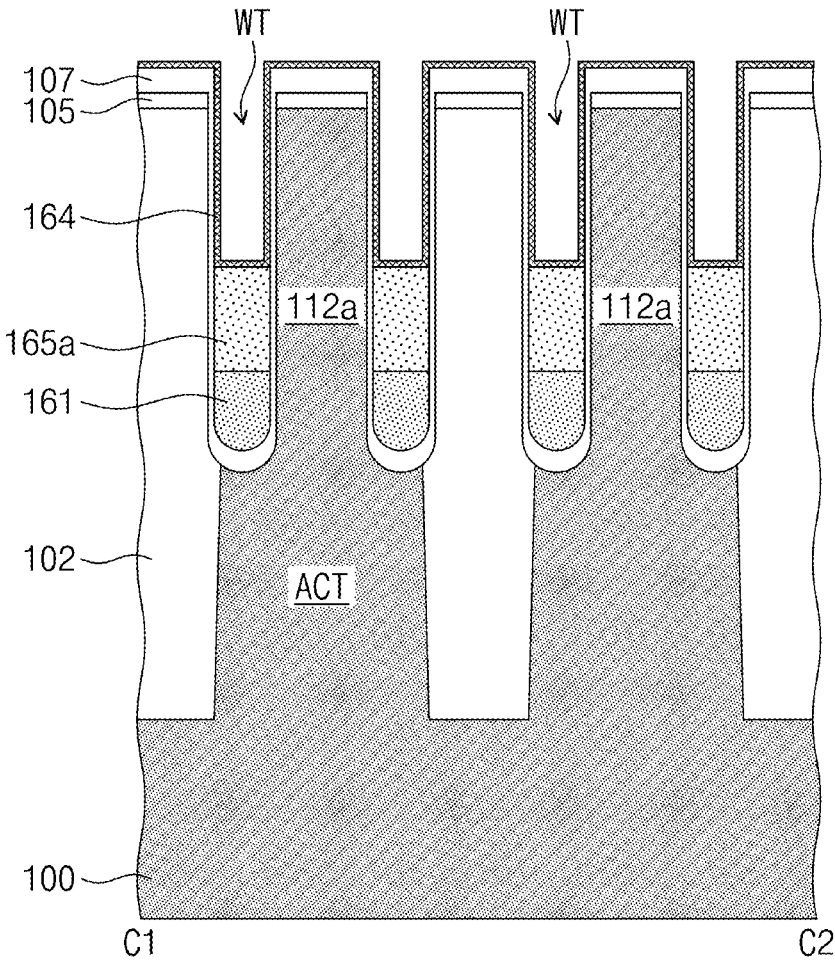

Referring to FIGS. 1, 12A, and 12B, a work function adjustment layer 164 covering an upper surface of the preliminary second conductive pattern 165a may be formed. The work function adjustment layer 164 may be, for example, an oxide layer of the above-described work function elements, such as lanthanum oxide (LaO), or a metal layer. The work function adjustment layer 164 may be formed by an ALD process, but example embodiments are not limited thereto.

Figure 13A:
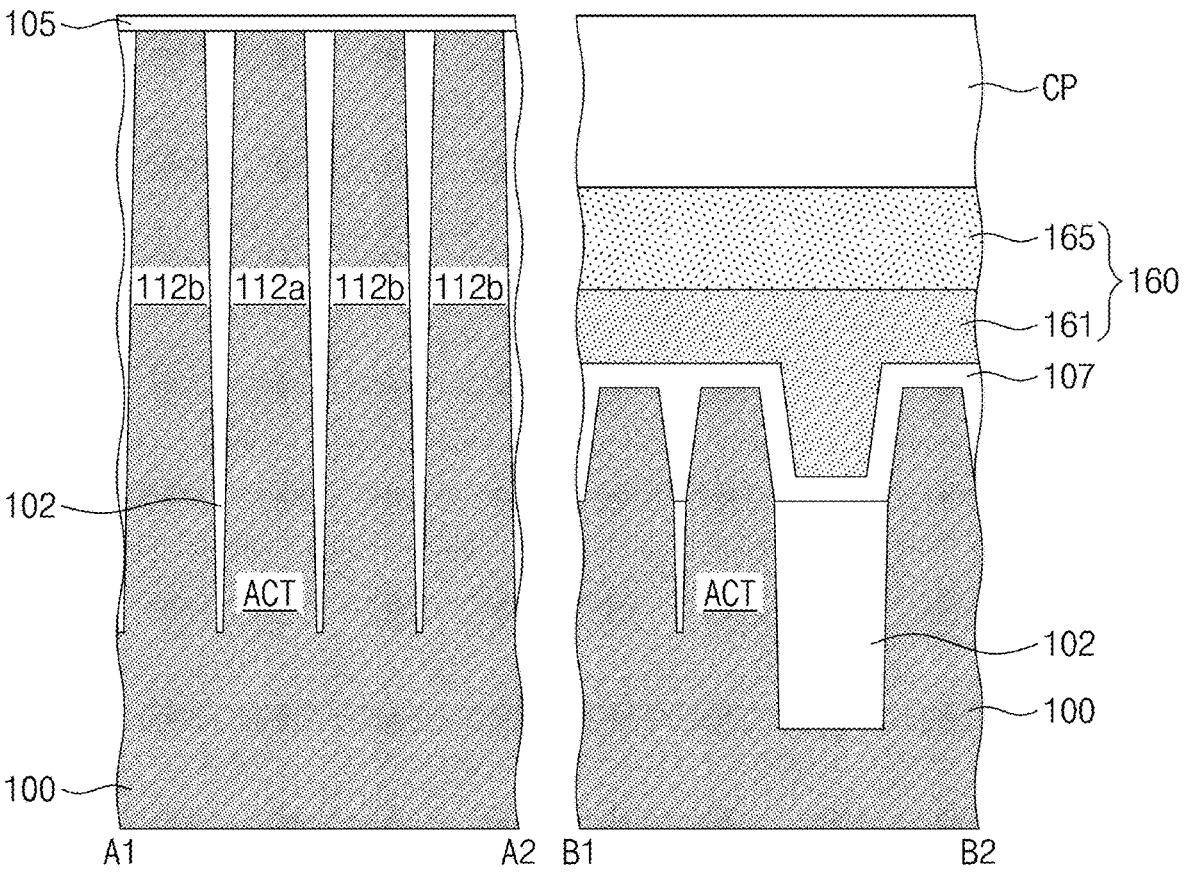
Figure 13B:
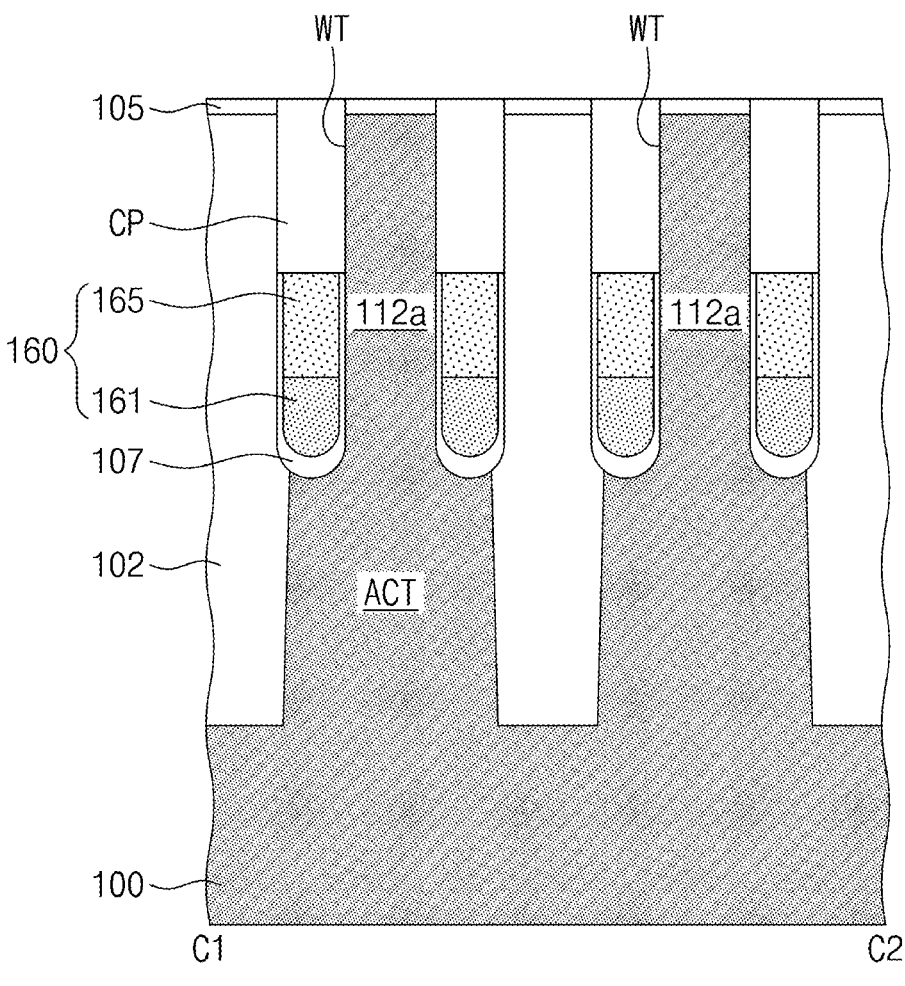

Referring to FIGS. 1, 13A, and 13B, a work function adjustment element from a work function adjustment layer 164 may diffuse into the preliminary second conductive pattern 165a. Accordingly, forming word lines 160 including the first conductive pattern 161 and the second conductive pattern 165 may be completed. Diffusing the work function adjustment element may be performed naturally at a deposition temperature of the work function adjustment layer 164 with an additional heat treatment process or without an additional heat treatment process. A distribution profile of the work function adjustment element may be determined by diffusion, and thus a concentration thereof may decrease from an upper portion of the second conductive pattern 165 to a lower portion thereof, as described above. After the diffusing of the work function adjustment element through the work function adjustment layer 164 is finished, a portion of the work function adjustment layer 164 remaining may be removed. A gate dielectric layer 107 may be separated from each other in the lower portions of the trenches WT. Capping insulating patterns CP may be formed on upper portions of the trenches WT.

Thereafter, the processes described with reference to FIGS. 2A and 2B may be performed to complete formation of the semiconductor memory device according to FIGS. 10A, 10B and 10C.

According to some example embodiments of the inventive concepts, the work function of the first conductive pattern may be limited or prevented from being unintentionally changed by the work function adjustment element.

While example embodiments are described above, a person of ordinary skill in the art may understand that many modifications and variations are made without departing from the spirit and scope of the present inventive concepts defined in the following claims. Accordingly, the example embodiments of the present inventive concepts should be considered in all respects as illustrative and not restrictive, with the spirit and scope of the present inventive concepts being indicated by the appended claims.

What is claimed is:

1. A semiconductor memory device, comprising:
   active regions on a substrate, the active regions defined by a device isolation layer;
   a word line crossing the active regions;
   a gate dielectric layer between the word line and the active regions;
   a capping insulating pattern at least partially covering an upper surface of the word line; and
   a bit line on the word line, wherein
   the word line includes a first conductive pattern and a second conductive pattern on the first conductive pattern, the first conductive pattern includes a first metal element, the second conductive pattern includes the first metal element, a work function adjustment element, and a diffusion barrier element, and an atomic radius of the diffusion barrier element is smaller than an atomic radius of the first metal element.

2. The semiconductor memory device of claim 1, wherein each of the first conductive pattern and the second conductive pattern further includes nitrogen.

3. The semiconductor memory device of claim 2, wherein the atomic radius of the diffusion barrier element is larger than an atomic radius of nitrogen.

4. The semiconductor memory device of claim 1, wherein the diffusion barrier element is silicon (Si), germanium (Ge), aluminum (Al), or vanadium (V).

5. The semiconductor memory device of claim 1, wherein a grain size of the second conductive pattern is smaller than a grain size of the first conductive pattern.

6. The semiconductor memory device of claim 1, wherein the work function adjustment element is lanthanum (La), strontium (Sr), antimony (Sb), yttrium (Y), aluminum (Al), tantalum (Ta), hafnium (Hf), iridium (Ir), zirconium (Zr), or magnesium (Mg).

7. The semiconductor memory device of claim 1, further comprising:

a third conductive pattern on the second conductive pattern, wherein the second conductive pattern covers lower and side surfaces of the third conductive pattern.

8. The semiconductor memory device of claim 7, wherein the third conductive pattern includes the first metal element, the work function adjustment element, and nitrogen.

9. The semiconductor memory device of claim 8, wherein a concentration of the work function adjustment element in the third conductive pattern decreases from an upper portion to a lower portion.

10. The semiconductor memory device of claim 8, wherein a concentration of the work function adjustment element in the second conductive pattern is lower than a concentration of the work function adjustment element in the third conductive pattern.

11. The semiconductor memory device of claim 1, wherein a sidewall of the second conductive pattern contacts the gate dielectric layer.

12. The semiconductor memory device of claim 1, wherein a ratio of the diffusion barrier element in the second conductive pattern is about 5 at % to about 30 at %.

13. A semiconductor memory device, comprising: active regions on a substrate, the active regions defined by a device isolation layer; a word line crossing the active regions; a gate dielectric layer between the word line and the active regions; a capping insulating pattern at least partially covering an upper surface of the word line; and a bit line on the word line, wherein the word line includes a first conductive pattern and a second conductive pattern on the first conductive pattern, the first conductive pattern includes a first metal element, the second conductive pattern includes the first metal element, a work function adjustment element, and a diffusion barrier element, and a grain size of the second conductive pattern is smaller than a grain size of the first conductive pattern.

14. The semiconductor memory device of claim 13, wherein the first conductive pattern includes nitrogen, the second conductive pattern includes nitrogen, and the diffusion barrier element has an atomic radius larger than an atomic radius of nitrogen.

15. The semiconductor memory device of claim 13, further comprising:

a third conductive pattern on the second conductive pattern, wherein the second conductive pattern covers lower and side surfaces of the third conductive pattern.

16. The semiconductor memory device of claim 15, wherein the third conductive pattern includes the first metal element, the work function adjustment element, and nitrogen.

17. The semiconductor memory device of claim 16, wherein a concentration of the work function adjustment element in the third conductive pattern decreases from an upper portion to a lower portion.

18. The semiconductor memory device of claim 17, wherein a concentration of the work function adjustment element in the second conductive pattern is lower than a concentration of the work function adjustment element in the third conductive pattern.

19. A semiconductor memory device, comprising:

active regions on a substrate, the active regions defined by a device isolation layer and including a first impurity region and a second impurity region;

word lines extending on the active regions and extending in a first direction;

capping insulating patterns at least partially covering upper surfaces of each of the word lines;

bit lines on the word lines and extending in a second direction crossing the first direction;

contact plugs between the bit lines and connected to the second impurity region; and data storage units on the contact plugs, wherein each of the word lines includes a first conductive pattern and a second conductive pattern on the first conductive pattern, the first conductive pattern includes a first metal element, the second conductive pattern includes the first metal element, a work function adjustment element, and a diffusion barrier element, and an atomic radius of the diffusion barrier element is smaller than an atomic radius of the first metal element.

20. The semiconductor memory device of claim 19, wherein a grain size of the second conductive pattern is smaller than a grain size of the first conductive pattern.

* * * * *